US012803584B2

(12) United States Patent
Wu et al.

(10) Patent No.: US 12,803,584 B2
(45) Date of Patent: Nov. 17, 2026

(54) DATA COMPRESSION DETERMINATION AND PROCESSING METHOD FOR RESISTIVITY LOGGING, AND SYSTEM

(71) Applicants: CHINA PETROLEUM & CHEMICAL CORPORATION, Beijing (CN); SINOPEC OILFIELD SERVICE CORPORATION, Beijing (CN); SINOPEC MATRIX CORPORATION, Qingdao (CN); GEOSTEERING & LOGGING RESEARCH INSTITUTE, SINOPEC MATRIX CORPORATION, Qingdao (CN)

(72) Inventors: Baizhi Wu, Qingdao (CN); Shouwei Zhang, Qingdao (CN); Xili Xi, Qingdao (CN); Zhen Yang, Qingdao (CN); Tongzheng Guo, Qingdao (CN); Shugang Hou, Qingdao (CN); Defu Zang, Qingdao (CN); Nan Lin, Qingdao (CN)

(73) Assignees: CHINA PETROLEUM & CHEMICAL CORPORATION, Beijing (CN); SINOPEC OILFIELD SERVICE CORPORATION, Beijing (CN); SINOPEC MATRIX CORPORATION, Qingdao (CN); GEOSTEERING & LOGGING RESEARCH INSTITUTE, SINOPEC MATRIX CORPORATION, Qingdao (CN)

( * ) Notice: Subject to any disclaimer, the term of this patent is extended or adjusted under 35 U.S.C. 154(b) by 81 days.

(21) Appl. No.: 19/124,324

(22) PCT Filed: Oct. 25, 2023

(86) PCT No.: PCT/CN2023/126492

§ 371 (c)(1),
(2) Date: Apr. 25, 2025

(87) PCT Pub. No.: WO2024/088304

PCT Pub. Date: May 2, 2024

(65) Prior Publication Data

US 2026/0180594 A1 Jun. 25, 2026

(30) Foreign Application Priority Data

Oct. 25, 2022 (CN) ......................... 202211309793.6
Oct. 25, 2022 (CN) ......................... 202211309795.5
Oct. 25, 2022 (CN) ......................... 202211309803.6

(51) Int. Cl.
*H03M 7/00* (2006.01)
*G01V 3/20* (2006.01)
*H03M 7/30* (2006.01)

(52) U.S. Cl.
CPC ................ *H03M 7/30* (2013.01); *G01V 3/20* (2013.01)

(58) Field of Classification Search
CPC .... H03M 7/30; H03M 7/3059; H03M 7/3064; H03M 7/6076; G01V 3/20; E21B 47/12; E21B 47/26; H04L 67/12; H04L 69/04
See application file for complete search history.

(56) References Cited

U.S. PATENT DOCUMENTS 7,647,182 B2 * 1/2010 Hassan .................. G01V 11/00 702/6
2007/0223822 A1 * 9/2007 Haugland ............ G01V 11/002 382/232

(Continued)

FOREIGN PATENT DOCUMENTS

| | | | |
|---|---|---|---|
| CA | 2857317 | A1 | 10/2005 |
| CN | 103236845 | A | 8/2013 |
| CN | 111984610 | A | 11/2020 |

*Primary Examiner* — Jean B Jeanglaude
(74) *Attorney, Agent, or Firm* — NKL LAW; Allen Xue

(57) ABSTRACT

A data-compression determining and processing method for resistivity logging includes steps of determining logging requirements, and collecting downhole data to be processed (Continued)

by a resistivity logging device; and selecting a compression processing approach based on compression requirements, so as to compress the downhole data to be processed. A two-segment data processing approach is selected when a required compression ratio is less than a preset compression ratio, and a three-segment data processing approach is selected when the required compression ratio is larger than or equal to the preset compression ratio. This method performs targeted compression for different types of data obtained in logging operations.

15 Claims, 16 Drawing Sheets

(56) References Cited

U.S. PATENT DOCUMENTS

| | | | |
|---|---|---|---|
| 2010/0156424 | A1 | 6/2010 | Bittar et al. |
| 2022/0213787 | A1 | 7/2022 | Schaecher et al. |

* cited by examiner

| | | | |
|---|---|---|---|
| First segment | × | × | × |
| Second segment | 0 | × | × |

| | | | |
|---|---|---|---|
| First segment | 1 | × | × |
| Middle segment | × | × | × |
| Last segment | 0 | × | × |

DATA COMPRESSION DETERMINATION AND PROCESSING METHOD FOR RESISTIVITY LOGGING, AND SYSTEM

CROSS-REFERENCE TO RELATED APPLICATIONS

The present application is a U.S. national stage entry of PCT application No. PCT/CN2023/126492, filed on Oct. 25, 2023, which claims the priorities of Chinese patent application No. 202211309803.6 entitled "Data compression judgment method and system for resistivity logging instrument" and filed on Oct. 25, 2022, Chinese patent application No. 202211309795.5 entitled "Two-segment data processing method" and filed on Oct. 25, 2022, and Chinese patent application No. 202211309793.6 entitled "Three-section data processing method" and filed on Oct. 25, 2022, the content of each is incorporated herein by reference in its entirety.

TECHNICAL FIELD

The present invention relates to the technical field of through-casing logging device for producing well in oil drilling, and specifically to a data-compression determining and processing method for resistivity logging, and a system adopting the same.

TECHNICAL BACKGROUND

With the development of logging technology, the configuration and quality of various logging devices have been improved to a certain extent, while the amount of data obtained by logging devices have also increased considerably. For comprehensive analysis of the logging data, all the valuable logging data need to be transmitted to the ground system efficiently in a timely manner. To this end, data compression technology for logging data with the increasing volume, with which the efficiency of subsequent transmission can be ensured, is one of the important research directions in the field.

Data compression technology refers to a method for reducing data volume and thus the storage space without loss of original data, in order to improve transmission, storage and processing efficiency. Alternately, in the technology the original data can also be re-encoded and organized through certain algorithm to reduce redundant data and thus the storage space. Generally, the input signal is encoded through certain algorithm, so that less bit stream is output as a replacement for the original signal. In the meantime, there is also an algorithm for recovering the output bit stream to a signal. If the recovered signal and the original signal are identical in a processing method, such method is classified as lossless compression. However, the coding and organization in such method is rather cumbersome with a limited degree of compression. In addition, the decompression in such method also requires complex algorithm, thus leading to low processing efficiency.

The compression ratio of lossless compression algorithm is relatively low, generally ½ to ⅕ of the original data volume. According to the compression model, lossless compression algorithm can be roughly divided into compression algorithm based on statistics and compression algorithm based on dictionary. In the prior arts, common lossless compression methods include Shannon-Fano Coding, Huffman Coding, Run-length Coding, and Lempel-Ziv-Welch Encoding. Although the above lossless compression methods each have its own advantages, they are not perfectly suitable for downhole data output by downhole devices.

At the same time, only one and the same compression method can be used for processing different data volume to be transmitted in different operations or by different logging devices. As a result, the operation for larger amount of data will lead to longer time consumption and thus lack practicability. Therefore, a simpler execution method for compression of logging data is needed.

In view of the above problems in the prior arts, the present invention proposes a data-compression determining and processing method for resistivity logging, which is simpler and more suitable for downhole data, and a system adopting the same.

The above information disclosed in the technical background is only intended to enhance the understanding of the general technical background of the present invention, and should not be regarded as an admission or implication in any form that the above information constitutes the prior arts already known to one skilled in the art.

SUMMARY OF THE INVENTION

In view of the above technical problems, the present invention proposes a data-compression determining and processing method for resistivity logging, which can achieve the same effect of lossless data compression without statistical and dictionary compression algorithms. The method according to the present invention comprises steps of:

- determining logging requirements, and collecting downhole data to be processed by a resistivity logging device; and
- selecting a compression processing approach based on compression requirements, so as to compress the downhole data to be processed, wherein a two-segment data processing approach is selected when a required compression ratio is less than a preset compression ratio, and a three-segment data processing approach is selected when the required compression ratio is larger than or equal to the preset compression ratio.

In one embodiment, the method comprises:

- device-scale determining step, wherein the distribution of data that needs to be obtained simultaneously is analyzed, thus determining a scale configuration of the downhole resistivity logging device required at a same depth;
- operation-parameter setting step, wherein the measurement requirements of each set of downhole resistivity logging device are determined, based on which a number of logging curves, a number of time channels in a logging cycle and the logging cycle of each downhole resistivity logging device are determined;
- data collecting step, wherein the resistivity logging curve is collected based on the configured downhole resistivity logging device, while specific downhole state data is collected by an associated data collection device; and
- compression determining step, wherein whether the current collected data needs compression or not is determined according to a type thereof, and the compression requirements are analyzed for the data that needs compression, based on which a matching compression approach is selected.

In one embodiment, the logging requirements include detection area requirements, wherein:

when only a near field area needs to be detected, at least one shallow detection resistivity logging device is adopted at a same depth;

when only a far field area needs to be detected, at least one deep detection resistivity logging device is adopted at a same depth; and when both the near field area and the far field area need to be detected, at least one shallow detection resistivity logging device and at least one deep detection resistivity logging device are adopted at a same depth, wherein the near field area and the far field area are divided according to a preset distance threshold.

In one embodiment, setting the number of logging curves for the downhole resistivity logging device includes: analyzing the data collection requirements of each device in each downhole resistivity logging device group, and determining a corresponding logging curve of the resistivity logging device according to each of various data collection requirements, wherein the total number of logging curves corresponding to all the requirements is the total number of logging curves to be collected by the current logging device.

In one embodiment, the logging requirements include measurement requirements, wherein:

when casing defect detection function and through-casing measurement function need to be completed simultaneously, each resistivity logging device is configured to complete four transient electromagnetic resistivity logging curves, which include a casing defect detection curve and a through-casing measurement curve received when a transmitting coil of each resistivity logging device transmits forward, and a casing defect detection curve and a through-casing measurement curve received when the transmitting coil of each resistivity logging device transmits backward.

In one embodiment, the logging requirements include operation parameter requirements, wherein:

a storage capacity of the resistivity logging device is obtained, and a number of data collection channels in a single cycle is determined in combination with a precision target in the measurement requirements, based on which a total time required for all time channels is determined as a logging cycle in combination with a preset single-channel collection time.

In one embodiment, determining whether the current data needs compression or not in the compression determining step includes identifying the type of the current data. If the current data is one of the downhole state data, it is determined that the current data does not need compression, and thus can be directly processed and encapsulated by a standard downhole data processing structure. The downhole state data includes at least three parameters of temperature, magnetic positioning and gamma. If the current data is time spectrum data measured by the downhole resistivity logging device, it is determined that the current data needs to be compressed before encapsulation.

In one embodiment, determining the compression approach for the current data in the compression determining step includes the following procedures. When it is determined that the current data is the time spectrum data measured by the downhole resistivity logging device, the compression requirements on the current data is analyzed according to the number of logging curves, the number of data collection channels in a single cycle and the data timeliness requirement associated with the corresponding downhole resistivity logging device. Different compression approaches corresponding to different compression analysis rules are selected based on the compression requirements. The compression approaches include type I compression approach and type II deep compression approach.

In one embodiment, the compression determining step includes expressing each time spectrum data in a set format for analyzing different bytes of the data, and selecting specified bytes as a basis for determining the compressibility of the data according to specific compression analysis rules, thus selectively performing compression on the compressible data bytes. The compression analysis rule is determined based on the analysis of changes in the logging data of the resistivity logging device in different periods.

In one embodiment, the type I compression approach is the two-segment data processing approach. The two-segment data processing approach comprises steps of:

processing, based on a sequence of time channels of the downhole data to be processed, time spectrum data corresponding to each time channel according to a first compression rule; and processing, when the first compression rule is not applicable to the time spectrum data corresponding to a certain time channel, the time spectrum data corresponding to each of the time channels starting from current time channel according to a second compression rule.

In one embodiment, the method further comprises steps of:

determining, when any bit within a specific bit range of the current time spectrum data is not a first preset value and thus the first compression rule is applicable, the current time spectrum data as incompressible data according to the first compression rule, and directly storing the current time spectrum data in a first buffer area; and determining, when each bit within the specific bit range of the current time spectrum data is the first preset value and thus the first compression rule is not applicable, the current time spectrum data as compressible data according to the second compression rule, and storing, after removing the data within the specific bit range of the current time spectrum data, remaining data in a second buffer area.

In one embodiment, the method further comprises the following steps. The data in the first and second buffer areas in the two-segment data processing approach are integrally encapsulated to obtain encapsulated data corresponding to the downhole data to be processed. The collected downhole temperature, magnetic positioning and gamma data are processed and compiled to form standardized data, and then encapsulated to obtain downhole-environment encapsulated data. The temperature, magnetic positioning and gamma parameters collected provide a correspondence relationship between the logging depth and the logging data of the transient electromagnetic resistivity downhole device, indicate the position of the casing collar in the casing well, and provide the gamma measurement data in the casing. The encapsulated data and the downhole-environment encapsulated data are combined together to form a data stream, which is transmitted to the ground through the preset bus.

In one embodiment, the time spectrum data is a 24-bit voltage amplitude digital signal, and the method further comprises steps of:

determining, when any bit in high 8 bits of the current time spectrum data is not "0" and thus the first compression rule is applicable, the current time spectrum data as incompressible data according to the first compression rule, and directly storing the current time spectrum data in the first buffer area in a 3-byte format; and determining, when each bit in the high 8 bits of the current time spectrum data is “0” and thus the first compression rule is not applicable, the current time spectrum data as compressible data according to the second compression rule, and storing, after removing “0” in the high 8 bits of the current time spectrum data, remaining data in the second buffer area in a 2-byte format.

In one embodiment, the type II deep compression approach is the three-segment data processing approach. The three-segment data processing approach comprises steps of:

processing, based on a sequence of time channels of the downhole data to be processed, time spectrum data corresponding to each time channel according to a third compression rule;

processing, when a fourth compression rule is applicable to the time spectrum data corresponding to a certain time channel, the time spectrum data corresponding to each of the time channels starting from current time channel according to the fourth compression rule; and processing, when a fifth compression rule is applicable to the time spectrum data corresponding to a certain time channel, the time spectrum data corresponding to each of the time channels starting from current time channel according to the fifth compression rule.

In one embodiment, the method comprises steps of:

determining, when each bit within a specific bit range of the current time spectrum data is a second preset value and thus the third compression rule is applicable, the current time spectrum data as compressible data according to the third compression rule, and storing, after removing the data in the specific bit range of the current time spectrum data, remaining data in a third buffer area;

determining, when the specific bit range of the current time spectrum data includes both the second preset value and a third preset value and thus the fourth compression rule is applicable, the current time spectrum data as incompressible data according to the fourth compression rule, and directly storing the current time spectrum data in a fourth buffer area; and determining, when each bit within the specific bit range of the current time spectrum data is a third preset value and thus the fifth compression rule is applicable, the current time spectrum data as compressible data according to the fifth compression rule, and storing, after removing the data in the specific bit range of the current time spectrum data, remaining data in a fifth buffer area.

In one embodiment, the method further comprises the following steps. The data in the third, fourth and fifth buffer areas in the three-segment data processing approach are integrally encapsulated to obtain encapsulated data corresponding to the downhole data to be processed. The collected downhole temperature, magnetic positioning and gamma data are processed and compiled to form standardized data, and then encapsulated to obtain downhole-environment encapsulated data. The temperature, magnetic positioning and gamma parameters collected provide a correspondence relationship between the logging depth and the logging data of the transient electromagnetic resistivity downhole device, indicate the position of the casing collar in the casing well, and provide the gamma measurement data in the casing. The encapsulated data and the downhole-environment encapsulated data are combined together to form a data stream, which is transmitted to the ground through the preset bus.

In one embodiment, the time spectrum data is a 24-bit voltage amplitude digital signal, and the method further comprises steps of:

determining, when each bit within high 8 bits of the current time spectrum data is “1” and thus the third compression rule is applicable, the current time spectrum data as compressible data according to the third compression rule, and storing, after removing “1” in the high 8 bits of the current time spectrum data, remaining data in the third buffer area in a 2-byte format;

determining, when the high 8 bits of the current time spectrum data include both “1” and “0” and thus the fourth compression rule is applicable, the current time spectrum data as incompressible data according to the fourth compression rule, and directly storing the current time spectrum data in the fourth buffer area in a 3-byte format; and determining, when each bit within the high 8 bits of the current time spectrum data is “0” and thus the fifth compression rule is applicable, the current time spectrum data as compressible data according to the fifth compression rule, and storing, after removing “0” in the high 8 bits of the current time spectrum data, remaining data is stored in the fifth buffer area in the 2-byte format.

In one embodiment, the downhole data to be processed refers to voltage amplitude digital signals output by a reception coil of the resistivity logging device when the resistivity logging device completes measurement of one logging curve within one collection period at a certain downhole depth measurement point, wherein one collection period is evenly divided into multiple time channels, and the time spectrum data refers to the voltage amplitude digital signal output by the reception coil at a certain moment within each time channel.

In one embodiment, the number of time channels is determined based on a balance between both the precision of the logging operation and the actual downhole storage capacity, wherein the number of time channels is 200-400.

In one embodiment, the method further comprises the following steps. The number of downhole devices is determined according to the logging requirements. When multiple sets of transient electromagnetic resistivity through-casing logging data with different detection depths needs to be provided simultaneously, at least two transient electromagnetic resistivity through-casing downhole devices for shallow and deep detections respectively need to be lowered simultaneously.

When the casing defect detection function and the through-casing measurement function need to be completed simultaneously, each resistivity logging device should complete four transient electromagnetic resistivity logging curves, which include the casing defect detection curve and the through-casing measurement curve received when the transmitting coil of each resistivity logging device transmits forward, and the casing defect detection curve and the through-casing measurement curve received when the transmitting coil of each resistivity logging device transmits backward.

According to another aspect of the present invention, a storage medium is also provided, which comprises a series of instructions for performing the steps of the above method.

According to another aspect of the present invention, a data-compression determining and processing system for resistivity logging device is also provided, which comprises:

- a device-scale determining module, wherein the distribution of data that needs to be obtained simultaneously is analyzed, thus determining a scale configuration of the downhole resistivity logging device required at a same depth;
- an operation-parameter setting module, wherein the measurement requirements of each downhole resistivity logging device group are determined, based on which a number of logging curves, a number of time channels in a logging cycle and the logging cycle of each downhole resistivity logging device are determined;
- a data collecting module, wherein the resistivity logging curve is collected based on the configured downhole resistivity logging device, while specific downhole state data is collected by an associated data collection device; and
- a compression determining module, wherein whether the current collected data needs compression or not is determined according to a type thereof, and the compression requirements are analyzed for the data that needs compression, based on which a matching compression approach is selected.

According to another aspect of the present invention, a resistivity logging system is also provided, comprising:

- a resistivity logging device configured to perform the above method; and
- a ground reception device configured to receive data transmitted by the resistivity logging device.

In one embodiment, the resistivity logging device is a transient electromagnetic resistivity logging device.

Compared with the prior arts, the data-compression determining and processing method for resistivity logging and a system adopting the same according to the present invention have the following advantages.

(a) By analyzing the distribution of data that needs to be obtained simultaneously, the present invention determines the scale configuration of the downhole resistivity logging devices for logging at a same depth, so that it is able to control the number of downhole logging devices flexibly and ensure that the logging requirements can be met without generating redundant logging data, serving as a reliable basis for subsequent determination of compression approaches.

(b) The number of logging curves, the number of time channels in a cycle, and the logging cycle of each downhole resistivity logging device are determined based on the measurement requirements thereof, so that the number of logging curves and the number of time channels can match the logging requirements, thus avoiding the one-size-fits-all configuration of logging devices for various logging operations. In this manner, the problems including insufficient logging data or the amount of logging data exceeding the storage space of the device can be eradicated from the source, while the determination of compression approaches can be also supported.

(c) The configured downhole resistivity logging devices are lowered into the well to collect resistivity logging curves. Meanwhile, the downhole state data is collected by the data collection device. The data that needs compression is selected according to the type thereof, for which the compression requirements are analyzed correspondingly, in order to select a matching compression approach. In this method, not all logging data is compressed. Instead, the data type and the logging requirements are both taken into consideration. The compressible data bytes that need compression are selected to realize precise and efficient compression. In practice, users can flexibly select data according to needs, in order to improve the upload speed of downhole data and reduce the pressure on the communication channel. In the meantime, the method and system according to the present application can also improve logging timeliness, providing a reliable technical support for the interpretation of logging data and the mapping of results.

(d) In terms of design concepts, the two-segment and three-segment data processing approaches according to the present invention do not adopt statistical-based and dictionary-based compressions commonly seen in the prior arts. Instead, a new two-segment and three-segment data compression and encapsulation method is customized according to the actual measurement curves of downhole logging devices. Compared with common compression algorithms in the prior arts, the method according to the present application can better adapt to downhole logging devices without complex algorithm, and thus is simpler and more convenient to perform. In terms of effect, the present invention can achieve lossless compression, wherein the downhole measurement data can be precisely restored after being decoded on the ground.

Other features and advantages of the present invention will be set forth in the description which follows, and, in part, will be apparent from the description, or may be learned from the implementation of the present invention. The objective and other advantages of the present invention may be realized and attained from the structure particularly pointed out in the description, claims and drawings.

BRIEF DESCRIPTION OF THE DRAWINGS

The accompanying drawings are used to provide a further understanding on the present invention, and constitute a part of the description. Together with the embodiments of the present invention, the drawings are intended to explain the present invention, but not constitute any limitation to the present invention. In the drawings.

In the drawings, the same reference numerals are used to indicate the same components. The drawings are not necessarily drawn to actual scales.

DETAILED DESCRIPTION OF EMBODIMENTS

Figure 1A:
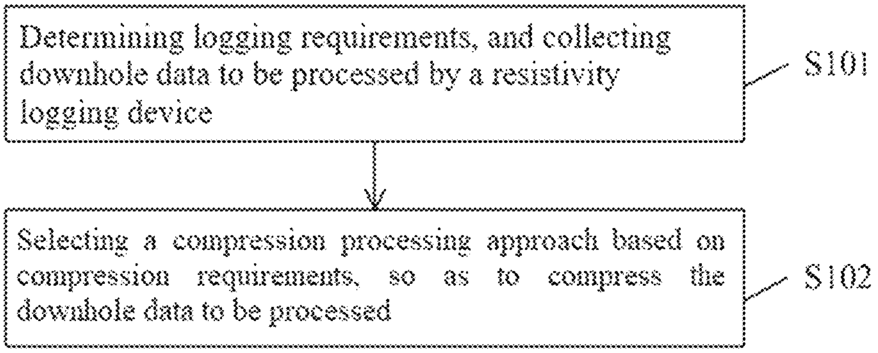
FIG. 1A is a flow diagram schematically showing a data-compression determining and processing method for resistivity logging according to one embodiment of the present invention.

In order to illustrate the purposes, the technical solutions and the advantages of the present invention more clearly, the embodiments of the present invention will be described as follows in detail in combination with the accompanying drawings.

With the development of logging technology in recent years, the configuration and quality of various logging devices have been improved to a certain extent, while the amount of data obtained by logging devices have also increased considerably. For comprehensive analysis of the logging data, all the valuable logging data need to be transmitted to the ground system efficiently in a timely manner. To this end, data compression technology for logging data with the increasing volume, with which the efficiency of subsequent transmission can be ensured, is one of the important research directions in the field.

Data compression technology refers to a method for reducing data volume and thus the storage space without loss of original data, in order to improve transmission, storage and processing efficiency. Alternately, in the technology the original data can also be re-encoded and organized through certain algorithm to reduce redundant data and thus the storage space. Generally, the input signal is encoded through certain algorithm, so that less bit stream is output as a replacement for the original signal. In the meantime, there is also an algorithm for recovering the output bit stream to a signal. If the recovered signal and the original signal are identical in a processing method, such method is classified as lossless compression. However, the coding and organization in such method is rather cumbersome with a limited degree of compression. In addition, the decompression in such method also requires complex algorithm, thus leading to low processing efficiency. At the same time, only one and the same compression method can be used for processing different data volume to be transmitted in different operations or by different logging devices. As a result, the operation for larger amount of data will lead to longer time consumption and thus lack practicability. Therefore, a simpler execution method for compression of logging data is needed.

In view of the above problems in the prior arts, the present invention proposes a data-compression determining and processing method for resistivity logging, and a system adopting the same, which realize different configuration and parameters of logging devices according to needs, based on which suitable data compression approach can be selected. In this manner, the processing efficiency in logging can be maximized without affecting data precision. For specific application, data compression approach can be selected according to needs in logging data. The method according to the present invention possesses better practicability since it is suitable for different geological conditions and different types of wells to be measured, ensuring reliable interpretation and mapping of logging data results.

Next, the detailed procedures of the method according to the embodiments of the present invention will be described as follows in combination with the accompanying drawings. In addition, the steps illustrated in the flow chart in the drawings can be performed in a computer system containing a set of computer-executable instructions. Moreover, although a logical sequence is shown in the flow chart, in some cases these steps as shown or described may be performed in an order different than that shown herein.

FIG. 1A is a flow diagram schematically showing a data-compression determining and processing method for resistivity logging according to one embodiment of the present invention.

As shown in FIG. 1A, in Step S101 logging requirements are determined, and downhole data to be processed is collected by a resistivity logging device.

As shown in FIG. 1A, in Step S102 a compression processing approach is selected based on compression requirements, so as to compress the downhole data to be processed.

In one embodiment, a two-segment data processing approach is selected when the required compression ratio is less than a preset compression ratio, and a three-segment data processing approach is selected when the required compression ratio is larger than or equal to the preset compression ratio. Specifically, the preset compression ratio may be any value within a range from 20% to 25%.

Figure 1B:
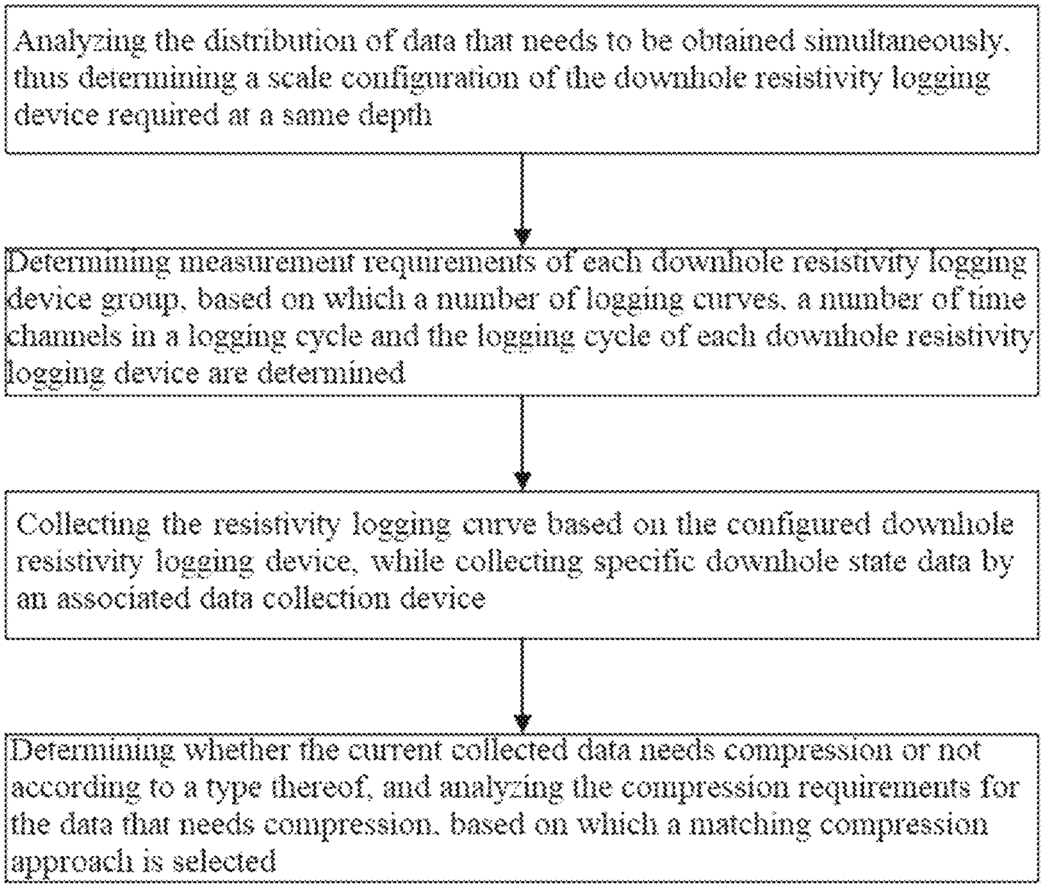
FIG. 1B is a flow diagram schematically showing a data-compression determining method of a resistivity logging device according to one embodiment of the present invention.

FIG. 1B is a flow diagram schematically showing a data-compression determining approach of a resistivity logging device according to one embodiment of the present invention.

As shown in FIG. 1B, the data-compression determining approach of the resistivity logging device includes:

- device-scale determining step, wherein the distribution of data that needs to be obtained simultaneously is analyzed, thus determining a scale configuration of the downhole resistivity logging device required at a same depth;
- operation-parameter setting step, wherein the measurement requirements of each downhole resistivity logging device group are determined, based on which a number of logging curves, a number of time channels in a logging cycle and the logging cycle of each downhole resistivity logging device are determined;
- data collecting step, wherein the resistivity logging curve is collected based on the configured downhole resistivity logging device, while specific downhole state data is collected by an associated data collection device; and compression determining step, wherein whether the current collected data needs compression or not is determined according to a type thereof, and the compression requirements are analyzed for the data that needs compression, based on which a matching compression approach is selected.

In logging operations, the amount of logging data is large while the logging device has limited local storage space. Therefore, it is usually necessary to collect the logging data at a required depth by the downhole logging device, which is then transmitted to a ground system for subsequent data analysis and logging information processing, so as to provide technical guidance for technicians to carry out operations. However, the data transmission rate is low when the logging data is directly transmitted. As a result, the logging data collection fails to meet the requirements of oil well exploration. Therefore, in the present invention the logging data is collected based on the logic of the above embodiment, and different collected data are compressed differently prior to transmission. In this manner, the time required for logging data transmission can be effectively saved without affecting the content and accuracy of the data, thus improving an upload speed of downhole data and reducing the pressure of the communication channel. In the meantime, the present invention can also improve logging timeliness, providing technical support for the interpretation and result mapping of logging data.

In the present invention, the number of downhole devices is determined according to the logging requirements. When multiple sets of transient electromagnetic resistivity through-casing logging data with different detection depths (coverage) needs to be provided simultaneously, for example, at least two transient electromagnetic resistivity through-casing downhole devices for shallow and deep detections respectively need to be lowered simultaneously. It should be noted that the distinction between resistivity logging devices for shallow and deep detections and the selection thereof are known in the field, or can be readily selected by one skilled in the art.

In one embodiment, in the device-scale determining step, the scale configuration of the downhole resistivity logging device required at the same depth is determined as follows.

When an area where the data to be collected simultaneously is distributed only covers a near field area, at least one shallow detection resistivity logging device is adopted for detection at the same depth, as a downhole resistivity logging device group. Specifically, the logging requirements include detection area requirements. When only the near field area needs to be detected, at least one shallow detection resistivity logging device is adopted for detection at the same depth, as a resistivity logging device group.

When the area where the data to be collected simultaneously is distributed only covers a far field area, at least one deep detection resistivity logging device is adopted for detection at the same depth, as a downhole resistivity logging device group. Specifically, the logging requirements include the detection area requirements. When only the far field area needs to be detected, at least one deep detection resistivity logging device is adopted for detection at the same depth, as a resistivity logging device group.

When the area where the data to be collected simultaneously is distributed covers both the near field area and the far field area, at least one shallow detection resistivity logging device and at least one deep detection resistivity logging device are adopted for detection at the same depth, as a downhole resistivity logging device group, wherein the near field area and the far field area are divided according to a preset distribution distance threshold. Specifically, the logging requirements include detection area requirements. When it is necessary to detect both the near field area and the far field area, at least one shallow detection resistivity logging device and at least one deep detection resistivity logging device are adopted at the same depth, wherein the near field area and the far field area are divided according to the preset distance threshold.

In practice, a downhole operation module is provided with a downhole resistivity logging device group, which includes at least one shallow detection resistivity logging device and at least one deep detection resistivity logging device.

Further, in the operation-parameter setting step, the number of logging curves, the number of time channels in the logging cycle and the logging cycle of each downhole resistivity logging device are set according to the measurement requirements of the downhole resistivity logging device.

The number of data receiving curves for each downhole device is selected according to the logging requirements. In one embodiment, setting the number of logging curves for the downhole resistivity logging device includes: analyzing the data collection requirements of each device in each downhole resistivity logging device group, and determining a corresponding logging curve of the resistivity logging device according to each of various data collection requirements, wherein the total number of logging curves corresponding to all the requirements is the total number of logging curves to be collected by the current logging device.

In practice, in an optional embodiment, setting the number of logging curves for the downhole resistivity logging device comprises the following steps.

If casing defect detection function and through-casing measurement function need to be completed simultaneously, each resistivity logging device needs to provide four transient electromagnetic resistivity curves, including a casing defect detection curve and a through-casing measurement curve received when transmitting coil transmits forward and backward respectively. Specifically, the logging requirements include the measurement requirements. When the casing defect detection function and the through-casing measurement function need to be completed simultaneously, each resistivity logging device should complete four transient electromagnetic resistivity logging curves, which include the casing defect detection curve and the through-casing measurement curve received when the transmitting coil of each resistivity logging device transmits forward, and the casing defect detection curve and the through-casing measurement curve received when the transmitting coil of each resistivity logging device transmits backward.

Specifically, when it is necessary to perform casing defect detection and through-casing measurement, one downhole device needs to provide at least four transient electromagnetic resistivity curves, which are marked as curve $\varepsilon$, curve $\zeta$, curve $\varepsilon'$ and curve $\zeta'$, wherein $\varepsilon$ and $\zeta$ indicate the casing defect detection curve and the through-casing measurement curve received when the transmitting coil transmits forward, respectively, while $\varepsilon'$ and $\zeta'$ indicate the casing defect detection curve and the through-casing measurement curve received when the transmitting coil transmits backward, respectively.

Further, in the logging procedure, the more the time channels in a single logging cycle, the larger the amount of measured data, the more precise the measured data, but at the same time the larger the capacity of the memory or cache to store these data, and the larger the space occupied by the downhole device. A suitable cycle for the logging depth measurement point is determined, in which each downhole device completes four transient electromagnetic resistivity measurement curves for all time channels.

Therefore, in the present invention the number of time channels of each measurement curve is determined according to the measurement precision requirements and the storage space of the downhole resistivity logging device. In a preferred embodiment, setting the number of time channels and the logging cycle of the downhole resistivity logging device includes: obtaining the storage capacity of the downhole device, setting the number of data collection channels in a single cycle in combination with a precision target in the measurement requirements, and further determining a total time required for all time channels as the logging cycle based on a preset single-channel collection time.

Specifically, the logging requirements include operation parameter requirements. The storage capacity of the resistivity logging device is obtained, based on which the number of data collection channels in a single cycle is set in combination with the precision target in the measurement requirements, and then the total time required for all time channels is determined as the logging cycle in combination with the preset single-channel collection time.

In practice, the suitable number of channels ranges from 200 to 400, which is usually 200, taking into consideration the measurement precision and the storage space of the logging device.

After the configuration according to the above embodiment, each downhole resistivity logging device is lowered to a required depth to collect the resistivity logging curves. Meanwhile, related downhole state data is collected by an associated data collection device.

In practice, the downhole state data is configured according to needs, and includes at least three parameters of temperature, magnetic positioning and gamma. These data can be obtained by any competent device or instrument, and is not particularly limited in the present invention, wherein the downhole state data should be consistent with the measurement depth of the obtained resistivity logging curve.

Based on the collected downhole state data such as temperature, magnetic positioning and gamma parameters, the logging data of the transient electromagnetic resistivity downhole device (such as the downhole data to be processed) can be associated with the logging depth, and the position of a casing collar in the casing well and the gamma measurement data in the casing can be obtained. Since the gamma curves measured before and after the wellbore is provided with casing are not affected by the casing, a correspondence between the state data and the depth can be further established by comparing the measured gamma curve in the casing with the gamma curve before the casing. Meanwhile, a one-to-one correspondence is also established between the casing and the formation outside the casing. In this manner, the logging data of the transient electromagnetic resistivity downhole device can be verified with respect to depth, thus ensuring the authenticity of the data.

Further, the compression determining step is performed for the collected data. Whether the current data needs compression or not is determined according to the type of the collected data. For the data that needs compression, a matching compression approach is selected.

In one embodiment, determining whether the current data needs compression or not in the compression determining step includes identifying the type of the current data. If the current data is one of the downhole state data, it is determined that the current data does not need compression, and thus can be directly processed and encapsulated by a standard downhole data processing structure, which is not particularly limited in the present invention and can be selected by one skilled in the art on an as-needed basis.

Moreover, if the current data is time spectrum data measured by the downhole resistivity logging device, it is determined that the current data needs to be compressed before encapsulation.

Further, in one embodiment, determining the compression approach for the current data in the compression determining step includes the following procedures.

When it is determined that the current data is the time spectrum data measured by the downhole resistivity logging device, the compression requirements on the current data is analyzed according to the number of logging curves, the number of data collection channels in a single cycle and the data timeliness requirement associated with the corresponding downhole resistivity logging device. Different compression approaches corresponding to different compression analysis rules are selected based on the compression requirements. The compression approaches include type I compression approach and type II deep compression approach, wherein the type I compression approach is also called as general compression approach, and the type II compression approach refers to an upgraded deep compression approach based on the general compression approach.

In one embodiment, the compression determining step includes expressing each time spectrum data in a set format for analyzing different bytes of the data, and selecting specified bytes as a basis for determining the compressibility of the data according to specific compression analysis rules, thus selectively performing compression on the compressible data bytes.

For each measurement curve in actual logging operation, A/D data output by a data processing unit of the downhole device is collected once for each time channel. The A/D data refers to transient measured value of the downhole device, which is a digital quantity as the time spectrum data corresponding to a time channel.

In the above embodiment, the A/D bits output by the data processing unit of the downhole device determine that the time spectrum data is expressed in the set format. In the present invention, the expression format is preferably a 24-bit format. When determining the data compression approach, each 24-bit measured value is divided into high, medium and low 8 bits for analysis. If the type I compression approach is used, the compressibility of the data is determined based on the following logics. The high 8 bits of the data are selected as the basis for determination. If all the high 8 bits are "0", the data is determined as compressible data. All the high 8 bits, each having a value of "0", of the 24-bit measured value are removed, and the last 16 bits are stored in a designated cache 1 in a 2-byte format. If any one of the high 8 bits is not "0", the data is determined as incompressible data. Then the 24-bit measured value is stored directly in a designated cache 2 in a 3-byte format. The above procedure is repeated, till all the time spectrum data of the current logging data curve is processed.

If the type II compression approach is used, the data compressibility is determined based on the following logics. The high 8 bits of each 24-bit measured value as the time spectrum data are determined. If all the 8 bits are "1", the data is determined as compressible data. The high 8 bits, each having a value of “1”, of the 24-bit measured value are removed, and the last 16 bits are stored in the designated cache 1 in a 2-byte format. If any one bit in the high 8 bits is not “0” and not all the 8 bits are “0”, the data is determined as incompressible data. The 24-bit measured value is stored directly in the designated cache 2 in a 3-byte format. If all the high 8 bits are “0”, the data is determined as compressible data. The high 8 bits, each having a value of “0”, of the 24-bit measured value are removed, and the last 16 bits are stored in a designated cache 3 in a 2-byte format. The above procedure is repeated, till all the time spectrum data of the current logging data curve is processed.

That is, for the logging data curve collected by the deep detection resistivity logging device, a compression determining logic different from that for the logging data curve collected by the shallow detection resistivity logging device is adopted as follows.

The high 8 bits of each 24-bit measured value as the time spectrum data are determined. If all the 8 bits are “1”, the data is determined as compressible data. The high 8 bits, each having a value of “1”, of the 24-bit measured value are removed, and the last 16 bits are stored in the designated cache 1 in a 2-byte format. If any one bit in the high 8 bits is not “0” and not all the 8 bits are “0”, the data is determined as incompressible data. The 24-bit measured value is stored directly in the designated cache 2 in a 3-byte format. If all the high 8 bits are “0”, the data is determined as compressible data. The high 8 bits, each having a value of “0”, of the 24-bit measured value are removed, and the last 16 bits are stored in a designated cache 3 in a 2-byte format. The above procedure is repeated, till all the time spectrum data of the current logging data curve is processed.

Both the type I compression approach and the type II in-depth compression approach in the present invention belong to lossless data compression. The type I compression approach can achieve a data compression ratio of 15-20%, and the type II deep compression approach can achieve a data compression ratio of 25-30%. Therefore, this method can achieve a considerably high level of data compression without statistical and dictionary compression algorithms.

Specifically, for example, for a data stream with an original capacity of 4800 bytes, the total capacity would be no more than 4000 bytes if the type I compression approach is used. On this basis, the time for transmitting the overall logging data of a depth measurement point is no more than 330 ms with a suitable transmission bus. If the type II deep compression approach is used, the total capacity would be no more than 3600 bytes. Accordingly, the time for transmitting the overall logging data of a depth measurement point is no more than 300 ms.

In practice, the compression determination is performed downhole in data communication with the downhole resistivity logging device. According to the preset configuration, a matching compression approach is selected for each resistivity logging curve of each transient electromagnetic resistivity logging device group, thereby generating compressed shallow detection transient electromagnetic resistivity logging curve and/or the deep detection transient electromagnetic resistivity logging curve. All the above compressed resistivity logging curves are encapsulated by a relevant processing module, thus forming a CAN compressed data stream.

In addition, the three parameters of temperature, magnetic positioning and gamma as the downhole state data do not need compression. Therefore, the three parameters collected are processed and compiled into standardized data, and then encapsulated to form a corresponding state data encapsulation package.

The CAN data stream formed by the above encapsulated resistivity logging curves are packed and received by a transmission module of the logging system through effective high-speed CAN bus transmission, and then combined with the state data encapsulation package and further encapsulated to generate a complete compressed data stream. On this basis, the transmission module converts said complete compressed data stream into a complete compressed data stream allowing for long-distance transmission, which is transmitted to the ground through a preset bus. After the data is unpacked and decompressed subsequently, recognizable or readable computer demonstration for shallow detection transient electromagnetic resistivity or deep detection transient electromagnetic resistivity can be formed.

It should be noted that the approaches for data decompression are performed based on respective rules, in order to ensure the consistency of the data before and after decompression.

Based on the approaches in the above embodiments, data compression on multiple logging curves of the downhole shallow detection and deep detection transient electromagnetic resistivity logging devices can reduce an upload amount of downhole logging data and improve the transmission capacity of the transmission channel, without affecting the measurement precision of the downhole logging devices.

In the data-compression determining and processing method for resistivity logging device according to the present invention, data of different types obtained in the logging procedure are compressed by corresponding compression approaches, which can be flexibly selected by users, facilitating precise and efficient logging data transmission.

For example, the data-compression determining and processing method for a downhole resistivity logging device group including one shallow detection resistivity logging device and one deep detection resistivity logging device is illustrated as follows.

The measurement requirements of each downhole resistivity logging device group are determined, based on which the number of logging curves, the number of time channels and the logging cycle of each downhole resistivity logging device are set.

Next, the shallow resistivity detection device is configured to form four transient electromagnetic resistivity logging curves at shallow detection depth, and the deep resistivity detection device is configured to form four transient electromagnetic resistivity logging curves at deep detection depth, including the casing defect detection curve and the through-casing measurement curve received when the transmitting coils transmit forward and backward respectively.

According to the logging requirements in this embodiment, at least four transient electromagnetic resistivity curves need to be provided by one downhole device, which are marked as ε, ζ, ε' and ζ' respectively, in order to perform the functions of casing defect detection and through-casing measurement. The curves ε and ζ indicate the casing defect detection curve and the through-casing measurement curve received when the transmitting coil transmits forward, respectively, and ε' and ζ' indicate the casing defect detection curve and the through-casing measurement curve received when the transmitting coil transmits backward, respectively. Therefore, if the information of one depth measurement point needs to be transmitted or stored, at least the data of eight time spectrum curves of two transient electromagnetic resistivity logging device groups need to be transmitted or stored, including the casing defect detection measurement curve $\varepsilon_s$ received when the transmitting coil of the shallow detection resistivity device transmits forward, the through-casing measurement curve $\zeta_s$ received when the transmitting coil of the shallow detection resistivity device transmits forward, the casing defect detection measurement curve $\varepsilon_s'$ received when the transmitting coil of the shallow detection resistivity device transmits backward, the through-casing measurement curve $\zeta_s'$ received when the transmitting coil of the shallow detection resistivity device transmits backward, the casing defect detection measurement curve $\varepsilon_d$ received when the transmitting coil of the deep detection resistivity device transmits forward, the through-casing measurement curve $\zeta_d$ received when the transmitting coil of the deep detection resistivity device transmits forward, the casing defect detection measurement curve $\varepsilon_d'$ received when the transmitting coil of the deep detection resistivity device transmits backward, and the through-casing measurement curve $\zeta_d'$ received when the transmitting coil of the deep detection resistivity device transmits backward.

The storage capacity of the logging device is obtained. The number of data collection channels in a single cycle is set based on the precision target in the measurement requirements, and then the total time required for all time channels is determined as the logging cycle based on a specified single-channel collection time. In this embodiment, the number of data collection channels in a single cycle is 200.

Next, the resistivity logging curves are collected based on the downhole resistivity logging devices configured as above. In the meantime, the specific downhole state data is collected by the associated data collection device, wherein the downhole state data includes temperature, magnetic positioning and gamma parameters.

Further, the compression determining step is performed. Whether the current data needs compression or not is determined according to the type of the collected data. Then the compression requirement for the data that needs compression is analyzed, so as to select the matching compression approach.

Specifically, the type of the current data is identified. If the current data is one of the downhole state data, it is determined that the current data does not need compression. The downhole state data includes temperature, magnetic positioning and gamma parameters.

If the current data is the time spectrum data measured by the downhole resistivity logging device, it is determined that compression is required.

Determining the compression approach of the current data includes the following steps. When it is determined that the current data is the time spectrum data measured by the downhole resistivity logging device, the compression requirement of the current data is analyzed according to the number of logging curves, the number of data collection channels in a single cycle and the data timeliness requirement of the corresponding downhole resistivity logging device. Then, different compression approaches corresponding to different compression analysis rules are selected based on the compression requirements. The compression approaches include type I compression approach and type II deep compression approach.

For each compression approach, each time spectrum data is expressed in a set format for analyzing different bytes of the data, and specified bytes are selected as a basis for determining the compressibility of the data according to the specified compression analysis rule, thus selectively performing compression on compressible data bytes. The compression analysis rule is determined based on the analysis of changes in the logging data of the resistivity logging device in different periods.

In practice, it is found that, based on an analysis of historical logging data of the resistivity logging device, the curve measured by the transient electromagnetic resistivity logging device (referred to as downhole device) is an uncompressed standard time spectrum curve characterized by a higher amplitude in a first section thereof and a lower amplitude in a second section thereof. The curve is ideally a monotonically descending curve.

Figure 2:
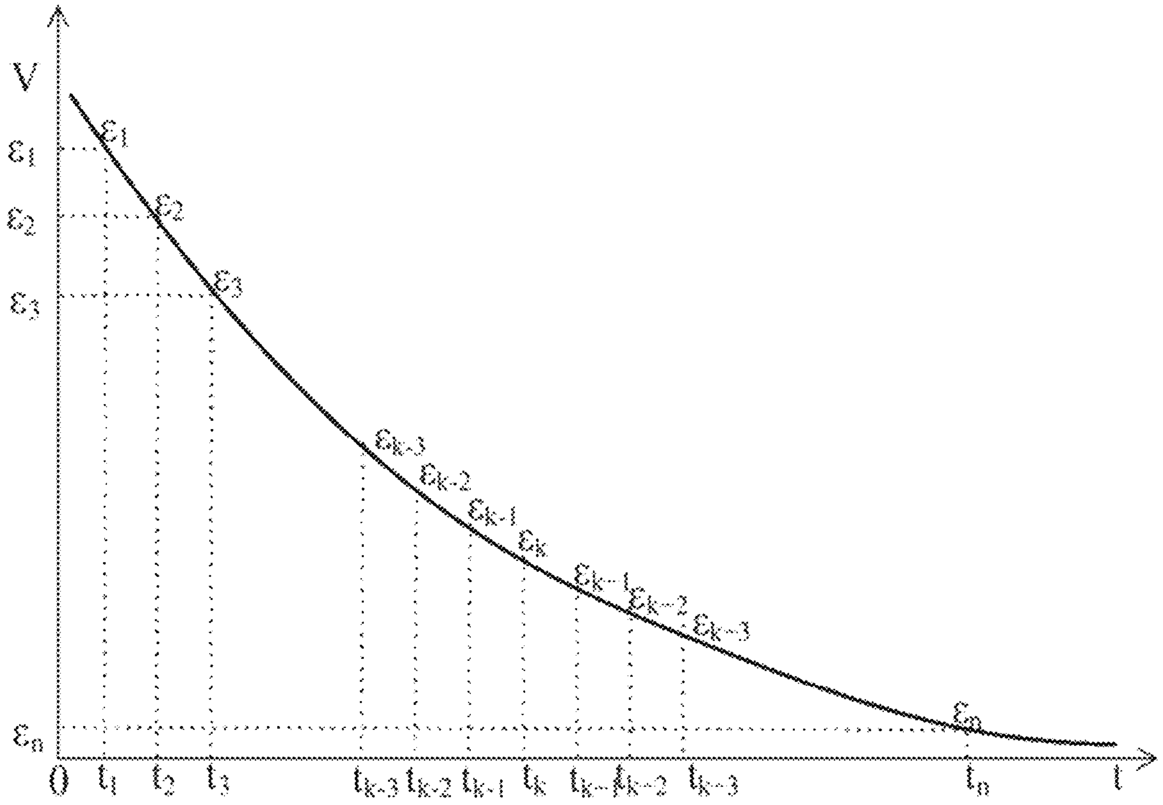
FIG. 2 shows an uncompressed standard logging curve collected at a measurement point of a certain depth according to an embodiment of the present invention.

FIG. 2 shows an uncompressed standard logging curve collected at a measurement point of a certain depth according to an embodiment of the present invention.

As shown in FIG. 2, a lateral axis denotes data collection time t, and a collection time period at one depth measurement point is $t_n$. A collection time period is evenly divided into n equal parts, each of which refers to a time channel. The time channel is a most basic data collection time unit, such as $t_1, t_2, \ldots, t_n$.

As shown in FIG. 2, a vertical axis refers to a voltage amplitude V of data collection, which is a 24-bit digital signal processed by two transient electromagnetic resistivity logging devices in the present invention. For a first time channel $t_1$, a voltage amplitude collected and output by a reception coil of the transient electromagnetic resistivity logging device is marked as $\varepsilon_1$. Correspondingly, for a second time channel $t_2$, the voltage amplitude collected and output by the reception coil of the transient electromagnetic resistivity logging device is marked as $\varepsilon_2$. For the $n^{th}$ time channel $t_n$, the voltage amplitude collected and output by the reception coil of the transient electromagnetic resistivity logging device is marked as $\varepsilon_n$.

It can be seen from FIG. 2 that at the first time channel $t_1$, the voltage amplitude $\varepsilon_1$ collected and output by the reception coil of the transient electromagnetic resistivity logging device is the largest. As time goes on, i.e., as the time channel increases, the voltage amplitude collected and output by the reception coil of the transient electromagnetic resistivity logging device gradually decreases. That is, the voltage amplitude in the curve attenuates as time goes on. Ideally, the time spectrum curve measured by the transient electromagnetic resistivity logging device is a monotonically descending curve within a period at a depth measurement point.

For the logging curve as shown in FIG. 2, when no compression is carried out, the 24-bit voltage amplitude digital signal (referred to as time spectrum data for short) of each time channel is stored in a 3-byte storage unit, recorded as "xxx", indicating that each of all the 24 bits of the 3 bytes may be "1" or "0". Each of high 8 bits, middle 8 bits and low 8 bits are stored in one corresponding byte. Each byte is represented by a "x", indicating that each bit of the 8 bits may be "1" or "0".

In a forward-attenuating time spectrum curve as shown in FIG. 2, the time spectrum data of the first time channel $t_1$ is the largest under normal circumstances. In the corresponding 3-byte storage unit, the 8 bits of a high byte should be 11111111, denoted as "1", any one of the 8 bits of a middle byte may be "1" or "0", denoted as "x", and any one of the 8 bits of a low byte may be "1" or "0", denoted as "x".

As shown in FIG. 2, a 24-bit voltage amplitude digital signal of the second time channel $t_2$ is less than that of the first time channel. In the corresponding 3-byte storage unit, the 8 bits of the high byte are still 11111111, denoted as "1", any one of the 8 bits of the middle byte may be "1" or "0", denoted as "x", and any one of the 8 bits of the low byte may be "1" or "0", denoted as "x".

As the time channel increases, the voltage amplitude received therein gradually decreases. In the corresponding 3-byte storage unit, the 8 bits of the high byte will no longer be "1", wherein "0" begins to appear in the low bits of said 8 bits, i.e., "x". Such a time channel is defined as $u^{th}$ time channel. The time spectrum data stored before the $u^{th}$ time channel can all be expressed as "1xx".

As the time channel continues to increase, the voltage amplitude received therein continues to decrease gradually. In the corresponding 3-byte storage unit, the 8 bits of the high byte will be 00000000 and no longer include "1", denoted as "0". Such a time channel is defined as $d^{th}$ time channel. In the time spectrum data stored between the $d^{th}$ time channel and the $u^{th}$ time channel, therefore, the 8 bits of any one of the high, middle or low bytes may include "1" or "0", which can be denoted as "xxx".

The time spectrum data stored after the $d^{th}$ time channel is denoted as "0" because the 8 bits of the high byte become 00000000. Therefore, the high, middle and low bytes can be expressed as "0xx".

For the actual shape of the logging curve of the transient electromagnetic resistivity logging device, a new two-segment data compression approach and a new three-segment data compression approach are customized according to the present invention, which can better adapt to downhole logging devices compared with compression algorithms commonly seen in the prior arts.

Figure 3:
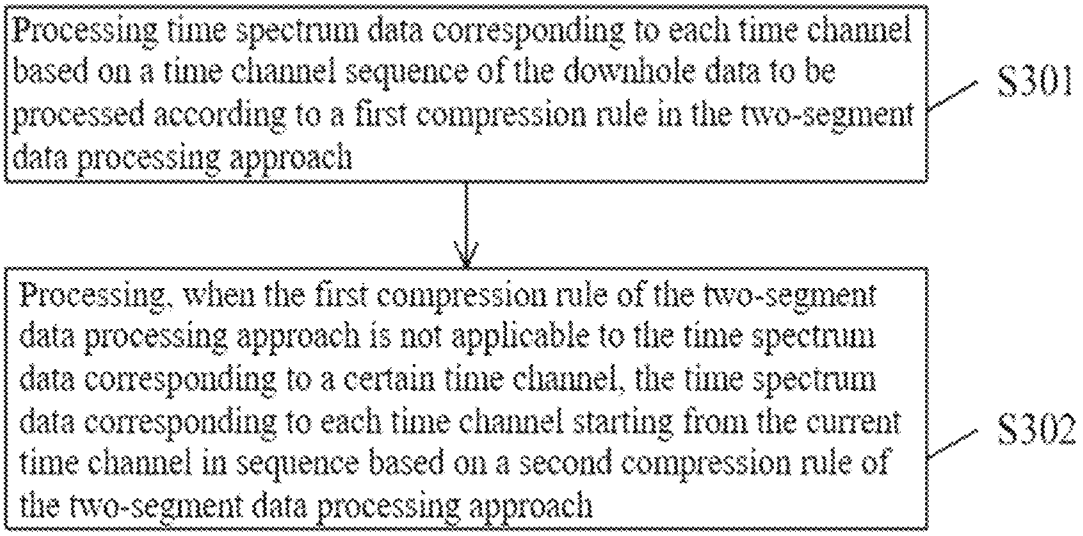
FIG. 3 is a flow diagram showing a two-segment data processing approach according to an embodiment of the present invention.

FIG. 3 is a flow diagram showing the two-segment data processing approach according to an embodiment of the present invention. Specifically, the type I compression approach is the two-segment data processing approach.

As shown in FIG. 3, in Step S301, the time spectrum data corresponding to each time channel is processed based on a time channel sequence of the downhole data to be processed according to a first compression rule in the two-segment data processing approach.

In one embodiment, the downhole data to be processed refers to the voltage amplitude digital signal output by the reception coil when the transient electromagnetic resistivity logging device completes the measurement of one logging curve within one collection period at a certain downhole depth measurement point, wherein one collection period is evenly divided into multiple sections, each of which indicates a time channel. The time spectrum data refers to the voltage amplitude digital signal output by the reception coil at a certain moment within each time channel.

In one embodiment, the number of time channels is determined based on a balance between both the precision of the logging operation and the actual downhole storage capacity, wherein the number of time channels is 200-400. Specifically, the larger the number of time channels, the denser the data collection of the reception coil, the more data calculated therefrom, and thus the more authentic and precise the description of the logging curve. Nevertheless, a larger amount of data needs to be stored or transmitted, resulting in risks such as instability of the transmission system, data blocking or code drop-out. Meanwhile, the logging device may be too long because more downhole storage space is required. Therefore, it is inadvisable to arrange as many time channels as possible. An appropriate range of the number of time channels is 200-400, without affecting the precision of data collection. Preferably, the number of time channels is 200.

In one embodiment, the transient electromagnetic resistivity logging device (resistivity logging device) includes an A/D converter unit, for converting a measured analog value of the voltage amplitude of the reception coil into the voltage amplitude digital signal. Further, the time spectrum data is a 24-bit voltage amplitude digital signal in binary format.

It should be noted that the two-segment data processing approach according to the present invention is also applicable to time spectrum data of other bits. The bit number of the time spectrum data is not limited in the present invention.

In Step S301, the first compression rule of the two-segment data processing approach is applicable if any bit within a specific bit range of the current time spectrum data is not a preset value (for example, "0"), in which case the current time spectrum data is determined as incompressible data, and directly stored in a first buffer area of the two-segment data processing approach.

Specifically, the first compression rule includes determining that the current time spectrum data is incompressible data if any bit within the specific bit range of the current time spectrum data is not the preset value (for example, "0"), and directly storing the current time spectrum data in the first buffer area of the two-segment data processing approach.

In one embodiment, the first compression rule of the two-segment data processing approach is applicable if any bit within the specific bit range of the current time spectrum data is not a first preset value (for example, "0"). Therefore, according to the first compression rule, the current time spectrum data is determined as incompressible data, and directly stored in the first buffer area.

As shown in FIG. 3, in Step S302, when the first compression rule of the two-segment data processing approach is not applicable to the time spectrum data corresponding to a certain time channel, the time spectrum data corresponding to each time channel starting from the current time channel is processed in sequence based on a second compression rule of the two-segment data processing approach.

In one embodiment, the first compression rule is not applicable when each bit within the specific bit range of the current time spectrum data is the first preset value (for example, "0"). Therefore, in the second compression rule, the current time spectrum data is determined as compressible data. After the data in the specific bit range of the current time spectrum data is removed, the remaining data is stored in a second buffer area.

Specifically, the second compression rule refers to determining the current time spectrum data to be compressible data when each bit within the specific bit range of the current time spectrum data is the preset value (for example, "0"), and storing, after removing the data in the specific bit range of the current time spectrum data, the remaining data in the second buffer area of the two-segment data processing approach.

In Step S302, the first compression rule of the two-segment data processing approach is not applicable when each bit within the specific bit range of the current time spectrum data is the preset value (for example, "0"). Therefore, according to the second compression rule of the two-segment data processing approach, the current time spectrum data is determined as compressible data. After the data in the specific bit range of the current time spectrum data is removed, the remaining data is stored in the second buffer area of the two-segment data processing approach.

By means of the data-compression determining and processing procedures as shown in FIG. 3, an uncompressed standard logging curve can be separated into two segments. The first segment is processed according to the first compression rule of the two-segment data processing approach, while the second segment is processed according to the second compression rule thereof, which can not only remove interference signals, such as noises, in the downhole data to be processed, but also realize lossless compression and improve the efficiency of data transmission while ensuring data precision.

Figure 4:
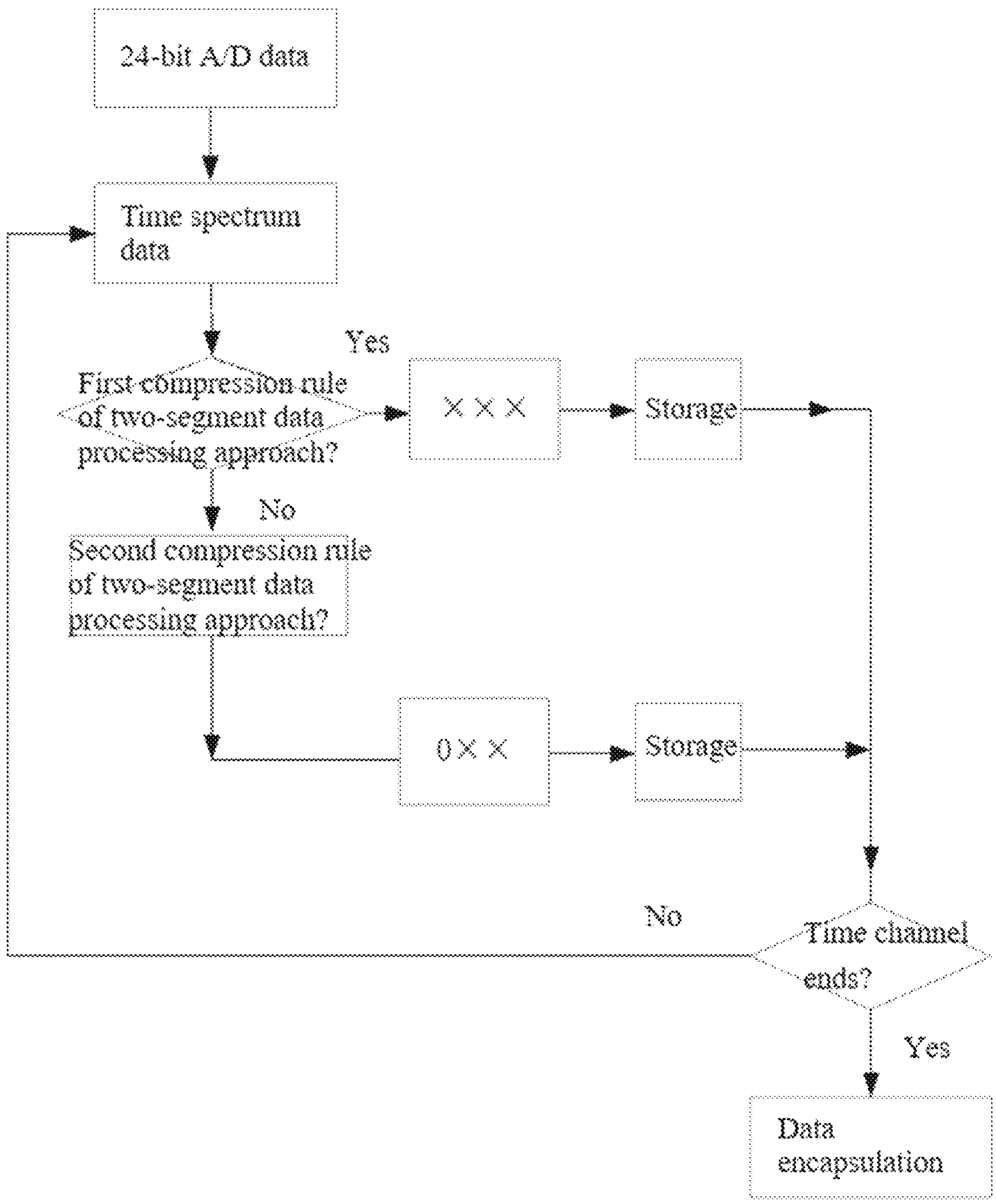
FIG. 4 is a flow diagram showing a two-segment data-compression determining and storage approach according to an embodiment of the present invention.

FIG. 4 is a flow diagram showing a two-segment data-compression determining and storage approach according to an embodiment of the present invention.

As shown in FIG. 4, the 24-bit A/D data output by the transient electromagnetic resistivity logging device is collected according to the sequence of time channels. The time channels are defined to obtain the time spectrum data (24-bit voltage amplitude digital signal) corresponding to the current time channel.

If any bit in the high 8 bits of the current time spectrum data is not "0", the first compression rule of the two-segment data processing approach is applicable, in which case the current time spectrum data is determined as incompressible data. Then the current time spectrum data is directly stored in the first buffer area of the two-segment data processing approach in a 3-byte format.

If all the high 8 bits of the current time spectrum data are "0", the first compression rule of the two-segment data processing approach is not applicable. According to the second compression rule of the two-segment data processing approach, the current time spectrum data is determined as compressible data. After removing the "0" in the high 8 bits of the current time spectrum data, the remaining data is stored in the second buffer area of the two-segment data processing approach in a 2-byte format.

If the defined time channels have been completed, it is determined that the time channels end, indicating that a complete measurement curve of the transient electromagnetic resistivity logging device has been stored in the specified buffer areas in a given format.

Figure 5:
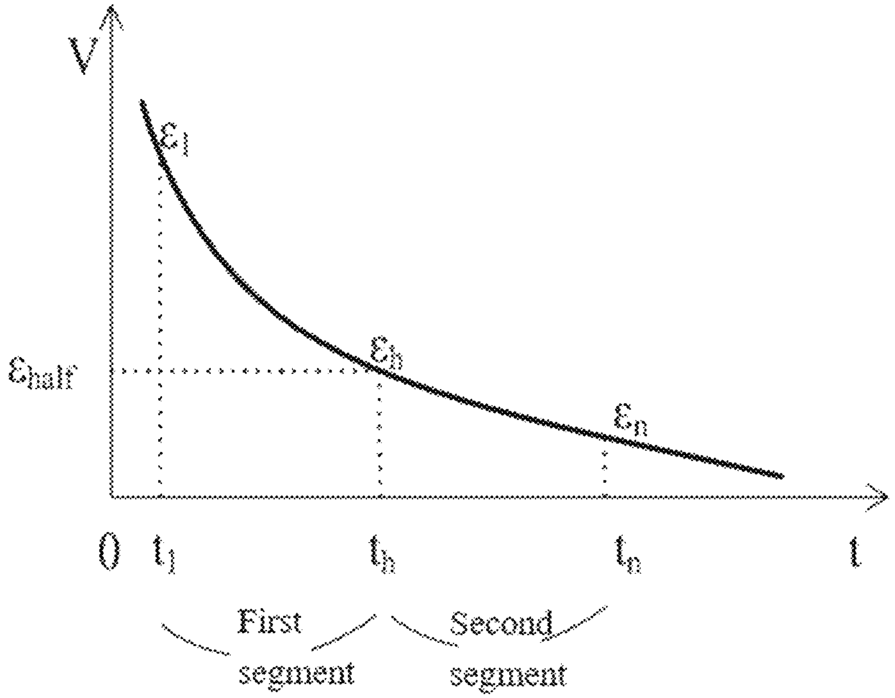
FIG. 5 schematically shows a two-segment compression logging curve according to an embodiment of the present invention.

FIG. 5 schematically shows a two-segment compressed logging curve according to an embodiment of the present invention.

As shown in FIG. 5, there is an $h^{th}$ time channel in the curve since the logging curve is a monotonically decreasing one. After the $h^{th}$ time channel, the 8 bits in the high byte of the corresponding time spectrum data have become 00000000, in which case the high, middle and low bytes can be expressed as "0xx". Before the $h^{th}$ time channel, all the high, middle and low bytes are set as "xxx" no matter they are 00000000 or not.

In the two-segment compression approach as shown in FIG. 4, the compression and storage procedures for a single logging curve are as follows. For the $1^{st}$ to $h^{th}$ time channels, the first compression rule of the two-segment data processing approach is used, wherein 3 bytes are stored for each time channel. For the $h^{th}$ to $n^{th}$ time channels, the second compression rule of the two-segment data processing approach is used, wherein the "0" in the high byte is removed for each time channel, and only the middle and low bytes are stored.

It has been proved in practice that the two-segment data compression can realize a lossless compression rate of 15-20%.

Figure 6:
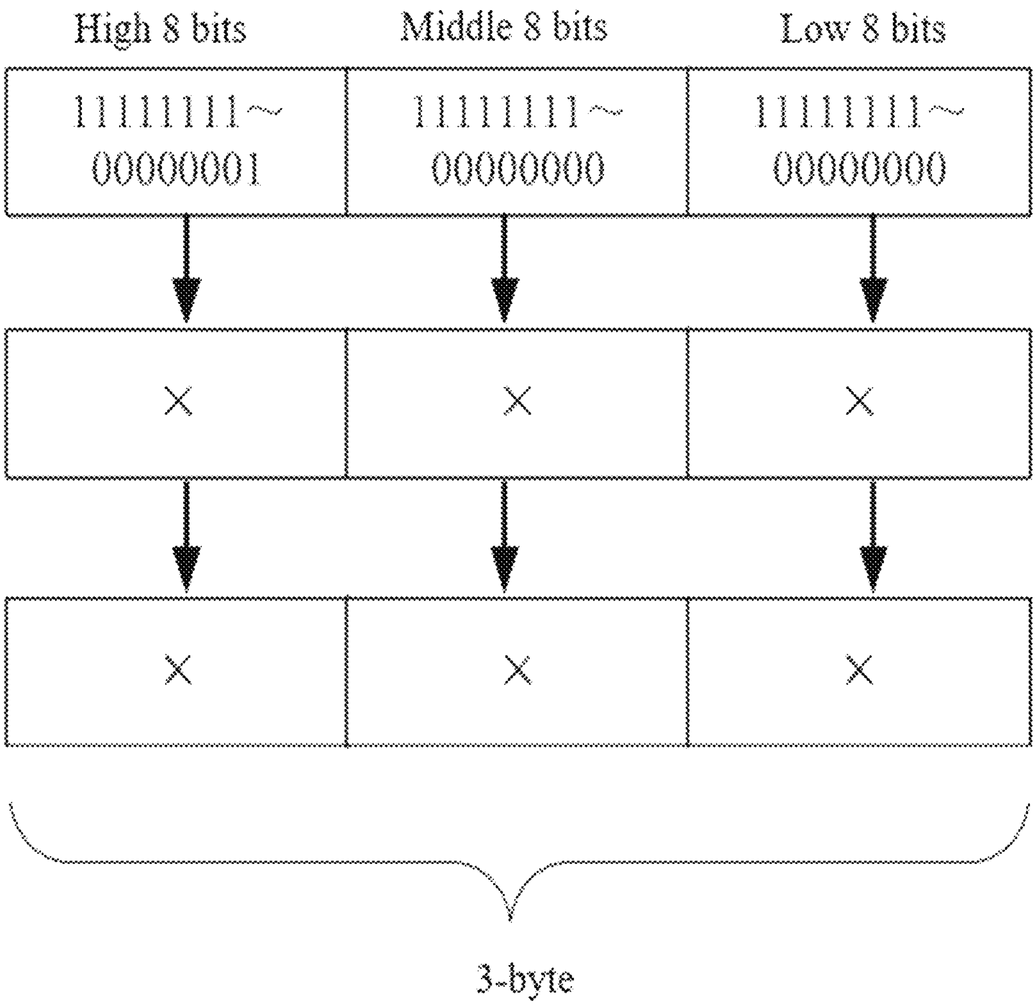
FIG. 6 schematically shows a first compression rule of the two-segment data processing approach according to an embodiment of the present invention.
Figure 7:
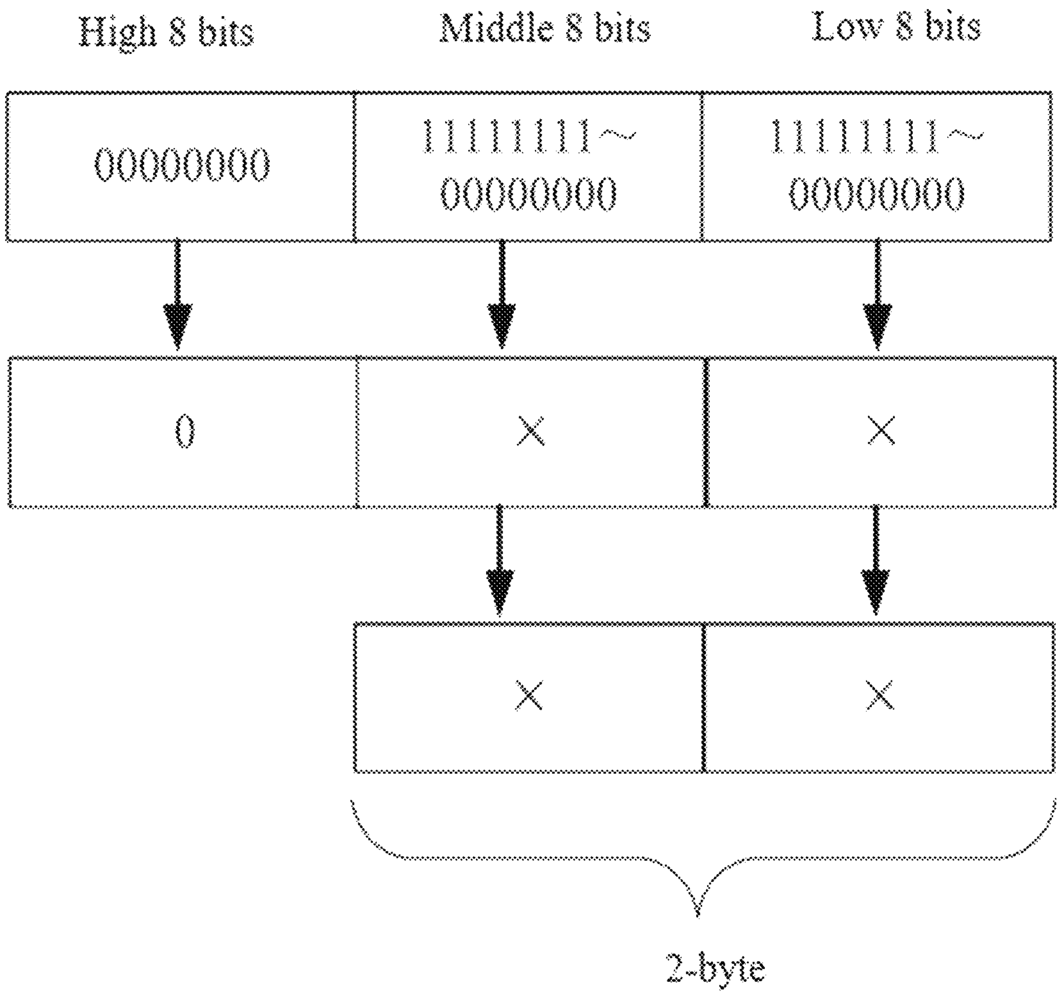
FIG. 7 schematically shows a second compression rule of the two-segment data processing approach according to an embodiment of the present invention.

FIGS. 6 and 7 schematically show the first compression rule and the second compression rule of the two-segment data processing approach according to an embodiment of the present invention.

In the two-segment data compression, the entire logging curve is divided into a first segment and a second segment. For the first segment, the useful signal is strong while the interference signal, such as noise, is weak. The useful signal is a main part of the signal. Therefore, the signal in the first segment plays a major role in ensuring the precision of data extraction and analysis.

As shown in FIG. 6, the signal in the first segment is strong. A 24-bit voltage amplitude digital signal collected for each time channel has high 8 bits ranging from 11111111~00000001, as well as middle 8 bits and low 8 bits both ranging from 11111111~00000000.

In this case, the high 8 bits, middle 8 bits and low 8 bits are all determined to be in the "x" format. Based on the first compression rule of the two-segment data processing approach, the time spectrum data of this time channel is stored in the specified buffer area in the "xxx" 3-byte format, as shown in FIG. 6.

As shown in FIG. 7, the signal in the second segment is weak. A time spectrum data is collected for each time channel, wherein the high 8 bits thereof have a range gradually decreasing from 11111111~00000001 to 00000000.

In this case, the high 8 bits are determined to be in the "0" format, and the middle 8 bits and the low 8 bits are still determined to be in the "x" format. Based on the second compression rule of the two-segment data processing approach, the high 8 bits of the time spectrum data of this time channel are removed, and the remaining data is stored in the specified buffer in the "0xx" 2-byte format, as shown in FIG. 7.

In the second segment, the useful signal gradually weakens, and the interference signal, such as noise, becomes the main signal. Therefore, the removal of meaningless "0" byte in the present invention has no impact on the measurement precision of the transient electromagnetic resistivity logging device.

Figure 8:
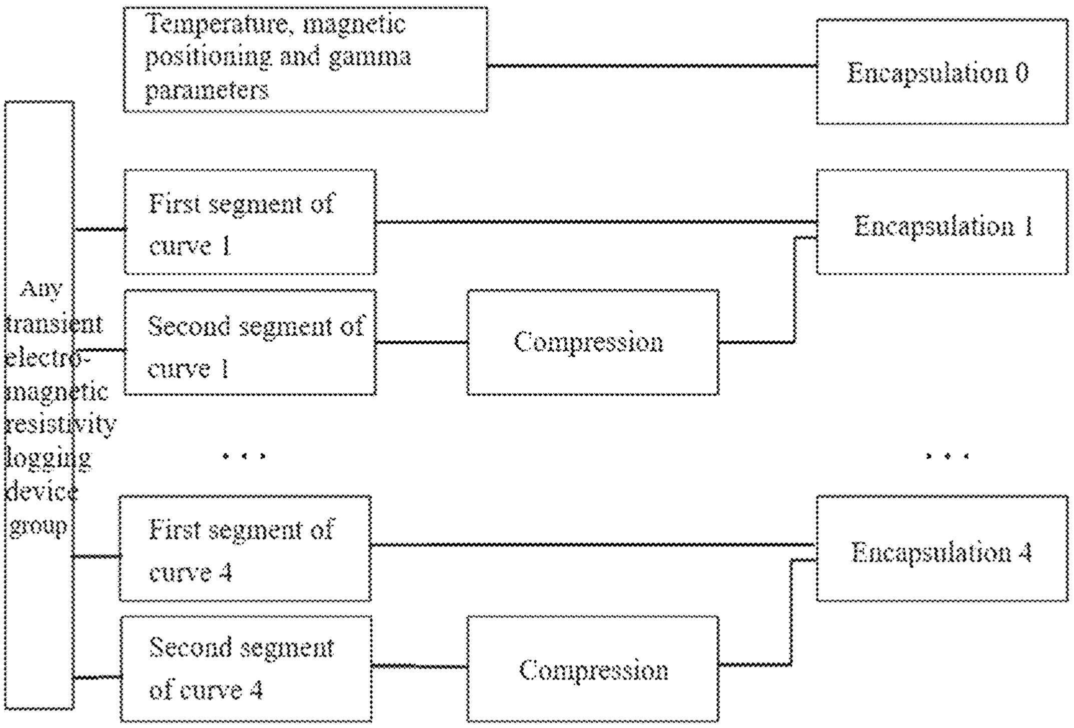
FIG. 8 schematically shows a two-segment data encapsulation approach according to an embodiment of the present invention.

FIG. 8 schematically shows a two-segment data encapsulation approach according to an embodiment of the present invention.

The present invention proposes a data encapsulation approach for a transient electromagnetic resistivity logging curve, which is used in cooperation with the two-segment data compression and storage approach. Specifically, the data in the first and second buffer areas in the two-segment data processing approach are integrally encapsulated to obtain encapsulated data corresponding to the downhole data to be processed. In addition, the collected downhole temperature, magnetic positioning and gamma data are processed and compiled to form standardized data, and then encapsulated to obtain downhole-environment encapsulated data. The encapsulated data and the downhole-environment encapsulated data are combined together to form a data stream, which is transmitted to the ground through the preset bus.

In one embodiment, before the logging operation, it is necessary to determine the number of downhole devices and the logging curve measurement tasks according to the logging requirements. In one embodiment, when it is necessary to provide transient electromagnetic resistivity logging data at different detection depths simultaneously, at least two transient electromagnetic resistivity logging devices for shallow detection and deep detection respectively need to be lowered simultaneously as the downhole resistivity logging devices. Specifically, when it is necessary to perform casing defect detection and through-casing measurement, one transient electromagnetic resistivity logging device needs to perform the measurement of at least four logging curves, i.e., provide four logging curves, including casing defect detection curve $\varepsilon_s$ and through-casing measurement curve $\zeta_s$ received when the transmitting coil transmits forward, and casing defect detection curve $\varepsilon_s'$ and through-casing measurement curve $\zeta_s'$ received when the transmitting coil transmits backward. Further, a suitable collection period for a logging depth measurement point is determined, in which each transient electromagnetic resistivity logging device completes four transient electromagnetic resistivity measurement curves for all time channels.

In one embodiment, for the shallow detection transient electromagnetic resistivity logging device, four transient electromagnetic resistivity logging curves at shallow detection depth are formed, i.e., $\varepsilon_s$ and $\varepsilon_s'$, $\zeta_s$ and $\zeta_s'$, wherein $\varepsilon_s$ and $\zeta_s$ are casing defect detection curve and through-casing measurement curve received when the transmitting coil transmits forward, respectively, and $\varepsilon_s'$ and $\zeta_s'$ are casing defect detection curve and through-casing measurement curve received when the transmitting coil transmits backward, respectively.

In one embodiment, for the deep detection transient electromagnetic resistivity logging device, four transient electromagnetic resistivity logging curves at deep detection depth are also formed, i.e., $\varepsilon_d$ and $\varepsilon_d'$, $\zeta_d$ and $\zeta_d'$.

Generally speaking, when it is necessary to provide transient electromagnetic resistivity logging data at different detection depths and perform both of casing defect detection and through-casing measurement, the data of eight curves are required in total, including time spectrum curve $\varepsilon_s$ characterized by formation resistivity signal and time spectrum curve $\zeta_s$ characterized by casing signal both under co-direction excitation of shallow detection, time spectrum curve $\varepsilon_s'$ characterized by formation resistivity signal and time spectrum curve $\zeta_s'$ characterized by casing signal both under reverse excitation of shallow detection, time spectrum curve ed characterized by formation resistivity signal and time spectrum curve $\zeta_d$ characterized by casing signal both under co-direction excitation of deep detection, and time spectrum curve $\varepsilon_d'$ characterized by formation resistivity signal and time spectrum curve $\zeta_d'$ characterized by casing signal both under reverse excitation of deep detection.

In the present invention, the data streams from two transient electromagnetic resistivity logging device groups are integrated into one data stream for transmission to the ground, in order to save more time. Therefore, when it is necessary to transmit or store the information at one downhole depth measurement point, at least the data of eight time spectrum curves of two transient electromagnetic resistivity logging device groups need to be transmitted or stored.

As shown in FIG. 8, according to the first compression rule of the two-segment data processing approach, the downhole data to be processed generated by any one of transient electromagnetic resistivity logging devices, which belongs to the first segment of the curve $\zeta_s$, is not compressed and directly sent to the first buffer area of the two-segment data processing approach for data encapsulation. According to the second compression rule of the two-segment data processing approach, the downhole data which belongs to the second section of the curve $\zeta_s$ needs to be compressed. After removal of "0" in the high byte and compression, the data is sent to the second buffer area of the two-segment data processing approach for data encapsulation. Then, all the data of the curve $\zeta_s$ is integrally encapsulated to form encapsulation data 1.

In the meantime, as shown in FIG. 8, according to the first compression rule of the two-segment data processing approach, the downhole data to be processed generated by any one of transient electromagnetic resistivity logging devices, which belongs to the first segment of the curve $\varepsilon_s$, is not compressed and directly encapsulated. According to the second compression rule of the two-segment data processing approach, the downhole data which belongs to the second segment of the curve $\varepsilon_s$ needs to be compressed. After removal of "0" in the high byte and compression, the data is encapsulated. Then, all the data of the curve $\varepsilon_s$ is integrally encapsulated to form encapsulation data 2.

As shown in FIG. 8, similarly, the downhole data to be processed generated by any one of transient electromagnetic resistivity logging devices which belongs to the curve $\zeta_s'$ and the curve $\varepsilon_s'$ is also compressed and encapsulated integrally to form encapsulation data 3 and encapsulation data 4 respectively.

As shown in FIG. 8, the temperature, magnetic positioning and gamma parameters collected are processed and compiled to form standardized data, which is not compressed and directly encapsulated to form encapsulation data 0.

Meanwhile, the four logging data curves collected at one depth measurement point of another transient electromagnetic resistivity logging device are encapsulated, forming encapsulation data 5~8.

The four shallow detection transient electromagnetic resistivity logging curves and the four deep detection transient electromagnetic resistivity logging curves are encapsulated, forming encapsulation data 1~8, which are further encapsulated to form one data stream. The data stream is sent to the transmission module through a CAN bus. The CAN bus divides the measurement data of one data stream into 450~600 standard frames according to a CAN-bus format. Meanwhile, the temperature, magnetic positioning, and gamma parameters collected are processed and compiled to form standardized data, which is then encapsulated to form encapsulation data 0 and compiled in the CAN data stream.

The temperature, magnetic positioning and gamma parameters collected provide a correspondence relationship between the logging depth and the logging data of the transient electromagnetic resistivity downhole device, indicate the position of the casing collar in the casing well, and provide the gamma measurement data in the casing. Since the gamma curves measured before and after the wellbore is provided with the casing are not affected by the casing, the correspondence relationship between the logging depth and the logging data can be further established, and at the same time, a one-to-one correspondence between the casing and the formation outside the casing can be established by measuring the gamma curve in the casing and comparing it with the gamma curve before the casing is arranged.

Through the transmission module, the CAN data stream forms an AMI data stream in an AMI mode through an AMI bus, which is sent to the ground and received by a decompression unit on the ground. The AMI data stream is decompressed in the decompression unit according to compression algorithm and restored to lossless data in the standard format for interpretation and display, in order to form formation, wellbore or casing information legible and readily identifiable by drilling or logging engineers. It has been proved in practice that through the two-segment compression algorithm, a total transmission time of the CAN data stream formed is reduced from 120 ms before compression to no more than 100 ms, and a total transmission time of the AMI data stream formed is reduced from 400 ms before compression to no more than 330 ms.

Due to the data compression, the transmission time of AMI data stream is significantly reduced. When the two-segment data compression approach is adopted, the time for the AMI data stream to transmit the data of one depth measurement point is no more than 330 ms, with a data compression rate reaching 15-20% and a data lossless rate of 100%.

The uncompressed standard logging curve as shown in FIG. 2 includes at least 200 time channels, each of which has a 24-bit voltage amplitude digital signal. If each 24-bit voltage amplitude digital signal is allocated a 3-byte storage unit, the storage capacity of one logging curve is at least 600 bytes. Correspondingly, the storage capacity of eight time spectrum curves is at least 4800 bytes. If the two-segment compression approach is adopted, the total storage capacity is no more than 4000 bytes.

The two-segment data processing approach according to the present invention performs data compression on eight logging curves of the downhole near-detection and far-detection transient electromagnetic resistivity logging devices, which reduces the upload amount of the downhole logging data and improves the transmission capacity of the transmission channel, while ensuring the measurement precision of the downhole logging device. Through lossless data compression, the two-segment data processing approach implemented in production wells is able to increase the upload speed of downhole data and reduce the pressure of the communication channel, thus improving the logging timeliness and providing technical support for interpretation and result mapping of the logging data.

Figure 9:
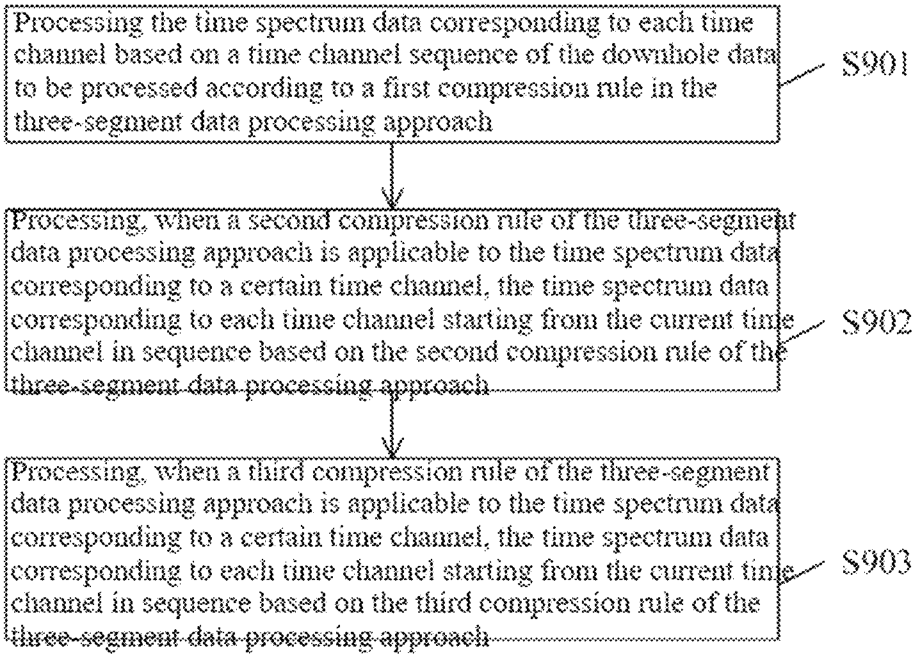
FIG. 9 is a flow diagram showing a three-segment data processing approach according to an embodiment of the present invention.

FIG. 9 is a flow diagram showing a three-segment data processing approach according to an embodiment of the present invention. Specifically, the type II deep compression approach is the three-segment data processing approach.

As shown in FIG. 9, in Step S901, the time spectrum data corresponding to each time channel is processed based on a time channel sequence of the downhole data to be processed according to a first compression rule in the three-segment data processing approach.

In one embodiment, the downhole data to be processed refers to the voltage amplitude digital signal output by the reception coil when the transient electromagnetic resistivity logging device completes the measurement of one logging curve within one collection period at a certain downhole depth measurement point, wherein one collection period is evenly divided into multiple sections, each of which indicates a time channel. The time spectrum data refers to the voltage amplitude digital signal output by the reception coil at a certain moment within each time channel.

In one embodiment, the number of time channels is determined based on a balance between both the precision of the logging operation and the actual downhole storage capacity, wherein the number of time channels is 200-400. Specifically, the larger the number of time channels, the denser the data collection of the reception coil, the more data calculated therefrom, and thus the more authentic and precise the description of the logging curve. Nevertheless, a larger amount of data needs to be stored or transmitted, resulting in risks such as instability of the transmission system, data blocking or code drop-out. Meanwhile, the logging device may be too long because more downhole storage space is required. Therefore, it is inadvisable to arrange as many time channels as possible. An appropriate range of the number of time channels is 200-400, without affecting the precision of data collection. Preferably, the number of time channels is 200.

In one embodiment, the transient electromagnetic resistivity logging device includes an A/D converter unit, for converting a measured analog value of the voltage amplitude of the reception coil into the voltage amplitude digital signal.

Further, the time spectrum data is a 24-bit voltage amplitude digital signal in binary format.

It should be noted that the three-segment data processing approach according to the present invention is also applicable to time spectrum data of other bits. The bit number of the time spectrum data is not limited in the present invention.

In Step S901, the first compression rule of the three-segment data processing approach is applicable when each bit within a specific bit range of the current time spectrum data is a first preset value (for example, "1"), in which case the current time spectrum data is determined as compressible data. After the data in the specific bit range of the current time spectrum data is removed, the remaining data is stored in a first buffer area of the three-segment data processing approach.

Specifically, the first compression rule of the three-segment data processing approach, termed as third compression rule for convenience, includes determining that the current time spectrum data is compressible data when each bit within the specific bit range of the current time spectrum data is the first preset value (for example, "1"), and storing, after the data in the specific bit range of the current time spectrum data is removed, the remaining data in the first buffer area of the three-segment data processing approach.

As shown in FIG. 9, in Step S902, when a second compression rule of the three-segment data processing approach is applicable to the time spectrum data corresponding to a certain time channel, the time spectrum data corresponding to each time channel starting from the current time channel is processed in sequence based on the second compression rule of the three-segment data processing approach.

In Step S902, the second compression rule of the three-segment data processing approach is applicable when the specific bit range of the current time spectrum data includes both the first preset value (for example, "1") and a second preset value (for example, "0"), in which case the current time spectrum data is determined as incompressible data and directly stored in a second buffer area of the three-segment data processing approach.

Specifically, the second compression rule of the three-segment data processing approach, termed as fourth compression rule for convenience, includes determining that the current time spectrum data is incompressible data when the specific bit range of the current time spectrum data includes both the first preset value (for example, "1") and the second preset value (for example, "0"), and directly storing the current time spectrum data in the second buffer area of the three-segment data processing approach.

As shown in FIG. 9, in Step S903, when a third compression rule of the three-segment data processing approach is applicable to the time spectrum data corresponding to a certain time channel, the time spectrum data corresponding to each time channel starting from the current time channel is processed in sequence based on the third compression rule of the three-segment data processing approach.

In Step S903, the third compression rule of the three-segment data processing approach is applicable when each bit within the specific bit range of the current time spectrum data is the second preset value (for example, "0"), in which case the current time spectrum data is determined as compressible data. After the data in the specific bit range of the current time spectrum data is removed, the remaining data is stored in a third buffer area of the three-segment data processing approach.

Specifically, the third compression rule of the three-segment data processing approach, termed as fifth compression rule for convenience, includes determining that the current time spectrum data is compressible data when each bit within the specific bit range of the current time spectrum data is the second preset value (for example, "0"), and storing, after the data in the specific bit range of the current time spectrum data is removed, the remaining data in the third buffer area of the three-segment data processing approach.

In one embodiment, the time spectrum data corresponding to each time channel is processed based on a time channel sequence of the downhole data to be processed according to the fifth compression rule. The fifth compression rule is applicable when each bit within the specific bit range of the current time spectrum data is the second preset value (for example, "1"), in which case the current time spectrum data is determined as compressible data. After the data in the specific bit range of the current time spectrum data is removed, the remaining data is stored in the third buffer area.

In one embodiment, when the fourth compression rule is applicable to the time spectrum data corresponding to a certain time channel, the time spectrum data corresponding to each time channel starting from the current time channel is processed in sequence based on the fourth compression rule. The fourth compression rule is applicable when the specific bit range of the current time spectrum data includes both the second preset value (for example, "1") and the third preset value (for example, "0"), in which case the current time spectrum data is determined as incompressible data and directly stored in a fourth buffer area.

In one embodiment, when the fifth compression rule is applicable to the time spectrum data corresponding to a certain time channel, the time spectrum data corresponding to each time channel starting from the current time channel is processed in sequence based on the fifth compression rule. The fifth compression rule is applicable when each bit within the specific bit range of the current time spectrum data is the third preset value (for example, "0"), in which case the current time spectrum data is determined as compressible data. After the data in the specific bit range of the current time spectrum data is removed, the remaining data is stored in a fifth buffer area.

By means of the compression determining and processing procedures as shown in FIG. 9, an uncompressed standard logging curve can be divided into three segments. The first segment is processed based on the first compression rule of the three-segment data processing approach, the middle segment is processed based on the second compression rule thereof, and the last segment is processed based on the third compression rule thereof, which can not only remove interference signals, such as noises, in the downhole data to be processed, but also realize lossless compression and improve the efficiency of data transmission while ensuring data precision.

Figure 10:
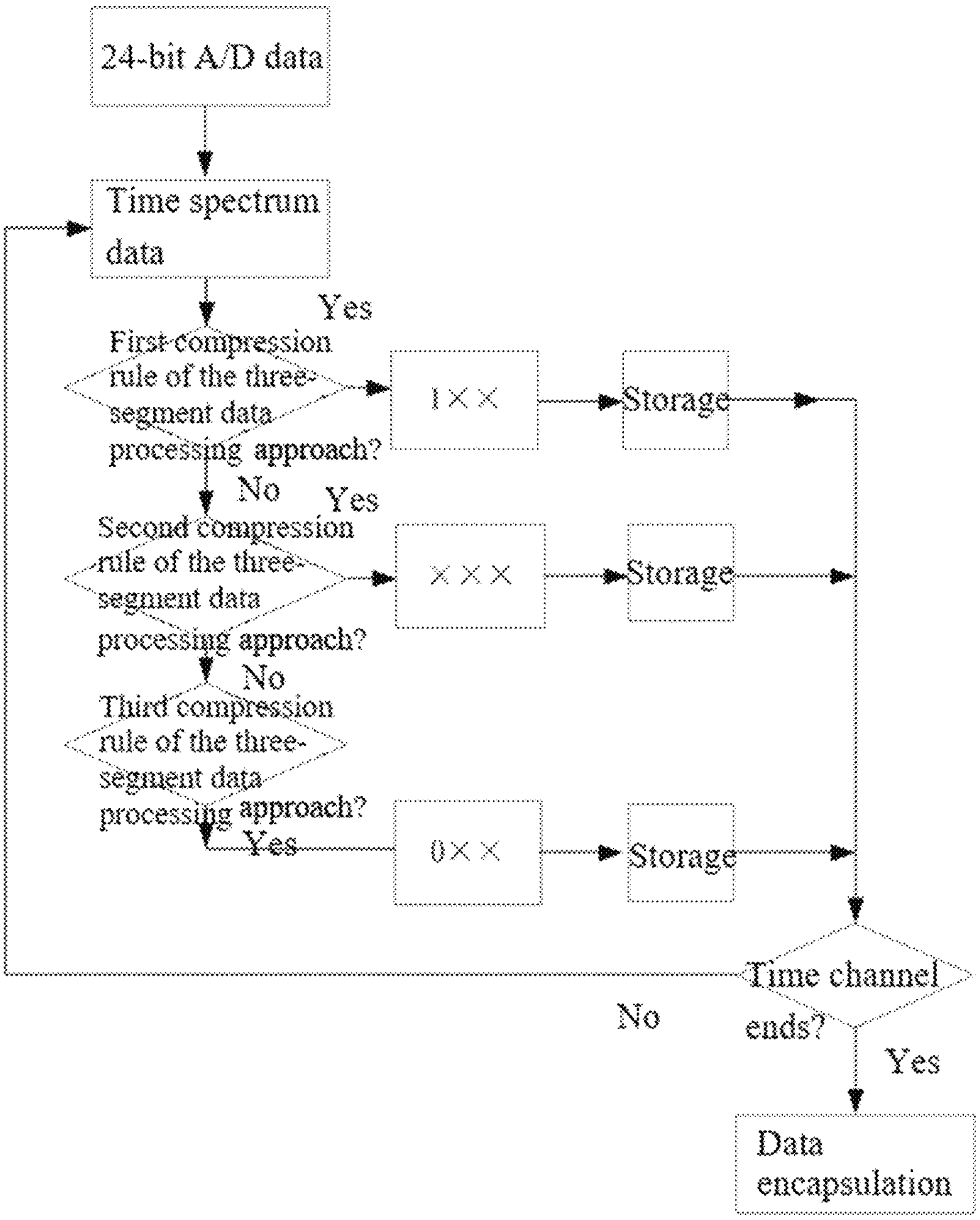
FIG. 10 is a flow diagram showing a three-segment data-compression determining and storage approach according to an embodiment of the present invention.

FIG. 10 is a flow diagram showing the three-segment data-compression determining and storage approach according to an embodiment of the present invention.

As shown in FIG. 10, the 24-bit A/D data output by the transient electromagnetic resistivity logging device is collected according to the sequence of time channels. The time channels are defined to obtain the time spectrum data (24-bit voltage amplitude digital signal) corresponding to the current time channel.

If each bit in the high 8 bits of the current time spectrum data is "1", the first compression rule of the three-segment data processing approach is applicable, in which case the current time spectrum data is determined as compressible data. After removing the "1" in the high 8 bits of the current time spectrum data, the remaining data is stored in the first buffer area of the three-segment data processing approach in the 2-byte format.

If the high 8 bits of the current time spectrum data include both "1" and "0", the second compression rule of the three-segment data processing approach is applicable, in which case the current time spectrum data is determined as incompressible data and directly stored in the second buffer area of the three-segment data processing approach in the 3-byte format.

If each bit of the high 8 bits of the current time spectrum data is "0", the third compression rule of the three-segment data processing approach is applicable, in which case the current time spectrum data is determined as compressible data. After removing the "0" in the high 8 bits of the current time spectrum data, the remaining data is stored in the third buffer area of the three-segment data processing approach in the 2-byte format.

If the defined time channels have been completed, it is determined that the time channels end, indicating that a complete measurement curve of the transient electromagnetic resistivity logging device has been stored in the specified buffer areas in a given format.

Figure 11:
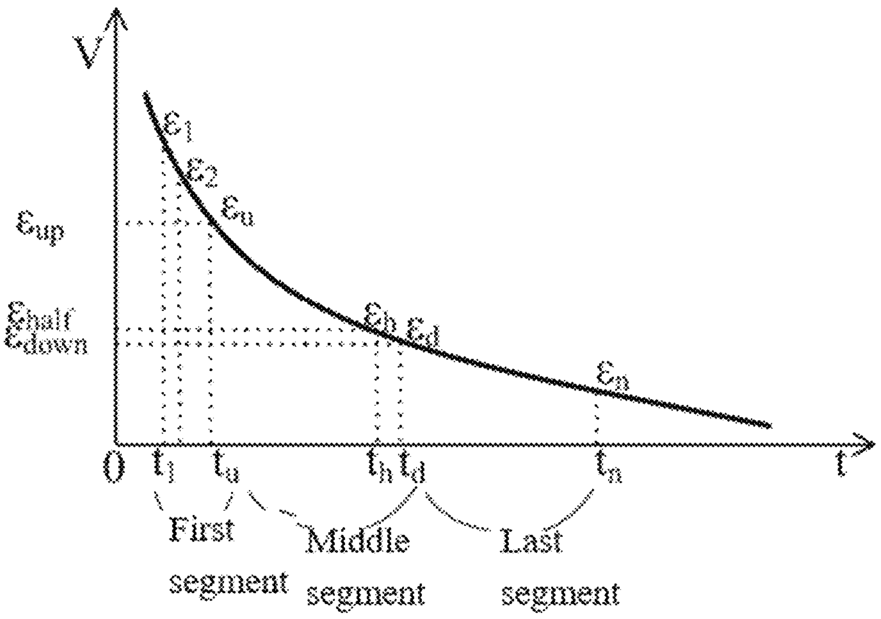
FIG. 11 schematically shows a three-segment compression logging curve according to an embodiment of the present invention.

FIG. 11 schematically shows a three-segment compressed logging curve according to an embodiment of the present invention.

As shown in FIG. 11, there is a $u^{th}$ time channel in the curve since the logging curve is a monotonically decreasing one. The time spectrum curves before the $u^{th}$ time channel are all set as "1xx". In the meantime, there is also a $d^{th}$ time channel. The time spectrum curves between the $u^{th}$ time channel and the $d^{th}$ time channel are all set as "xxx". After the $d^{th}$ time channel, the time spectrum curves are all set as "0xx".

In the three-segment compression approach as shown in FIG. 10, the compression and storage procedures for a single logging curve are as follows. For the $1^{st}$ to $u^{th}$ time channels, the first compression rule of the three-segment data processing approach is used, wherein the "1" in the high byte of the curve corresponding to each time channel is removed, and only the middle and low bytes are stored. For the $u^{th}$ to $d^{th}$ time channels, the second compression rule of the three-segment data processing approach is used, wherein the curve of each time channel is stored in the 3-byte format. For the $d^{th}$ to $n^{th}$ time channels, the third compression rule of the three-segment data processing approach is used, wherein the "0" in the high byte of the curve corresponding to each time channel is removed, and only the middle and low bytes are stored.

It has been proved in practice that the three-segment data compression approach can realize a lossless data compression rate of 25-30%.

Figure 12:
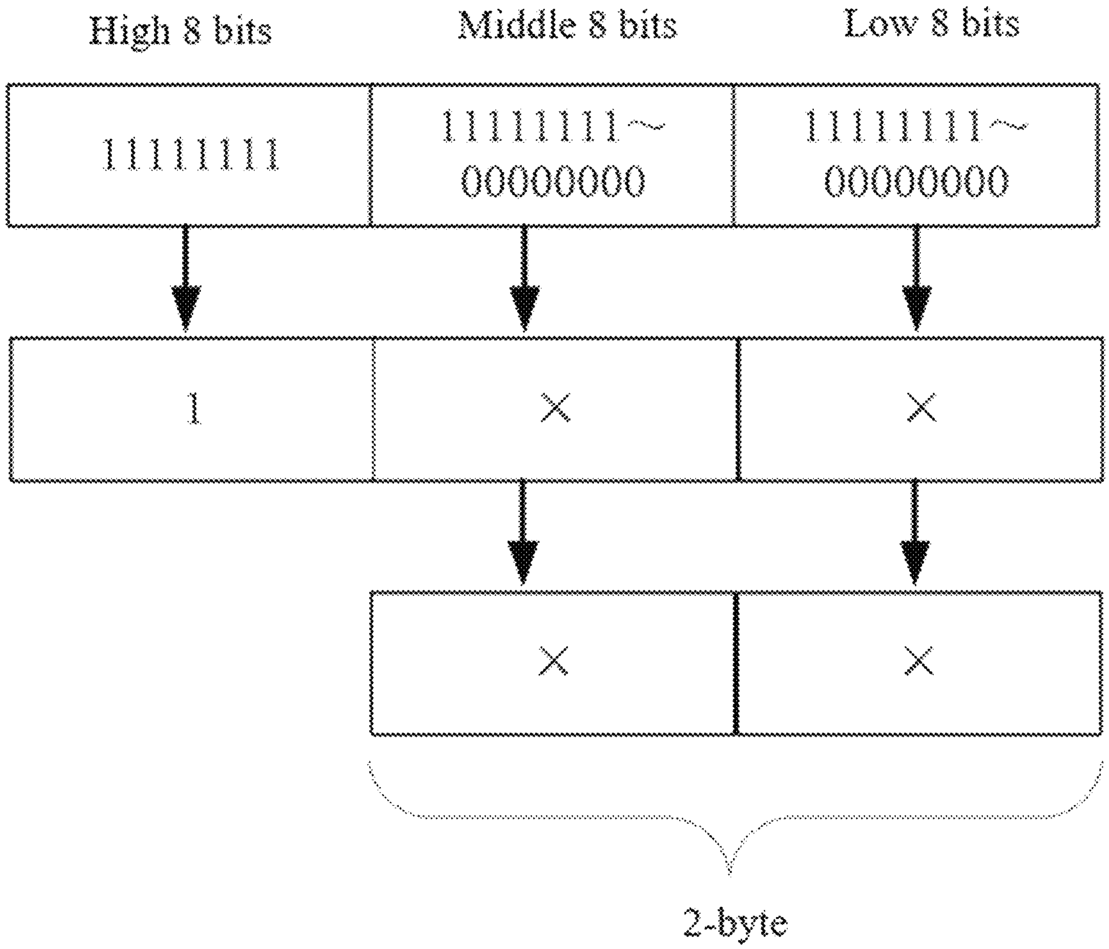
FIG. 12 schematically shows a first compression rule of the three-segment data processing approach according to an embodiment of the present invention.
Figure 13:
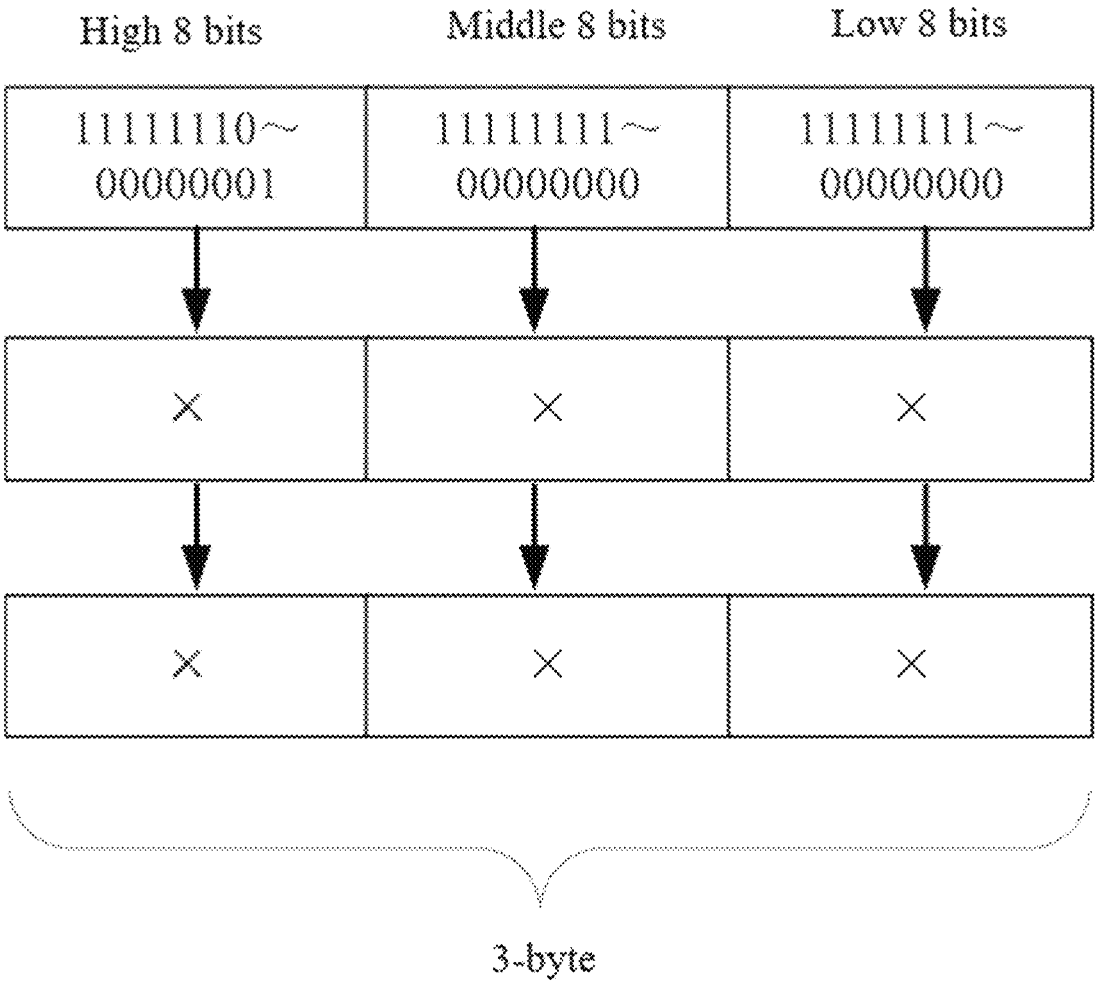
FIG. 13 schematically shows a second compression rule of the three-segment data processing approach according to an embodiment of the present invention.
Figure 14:
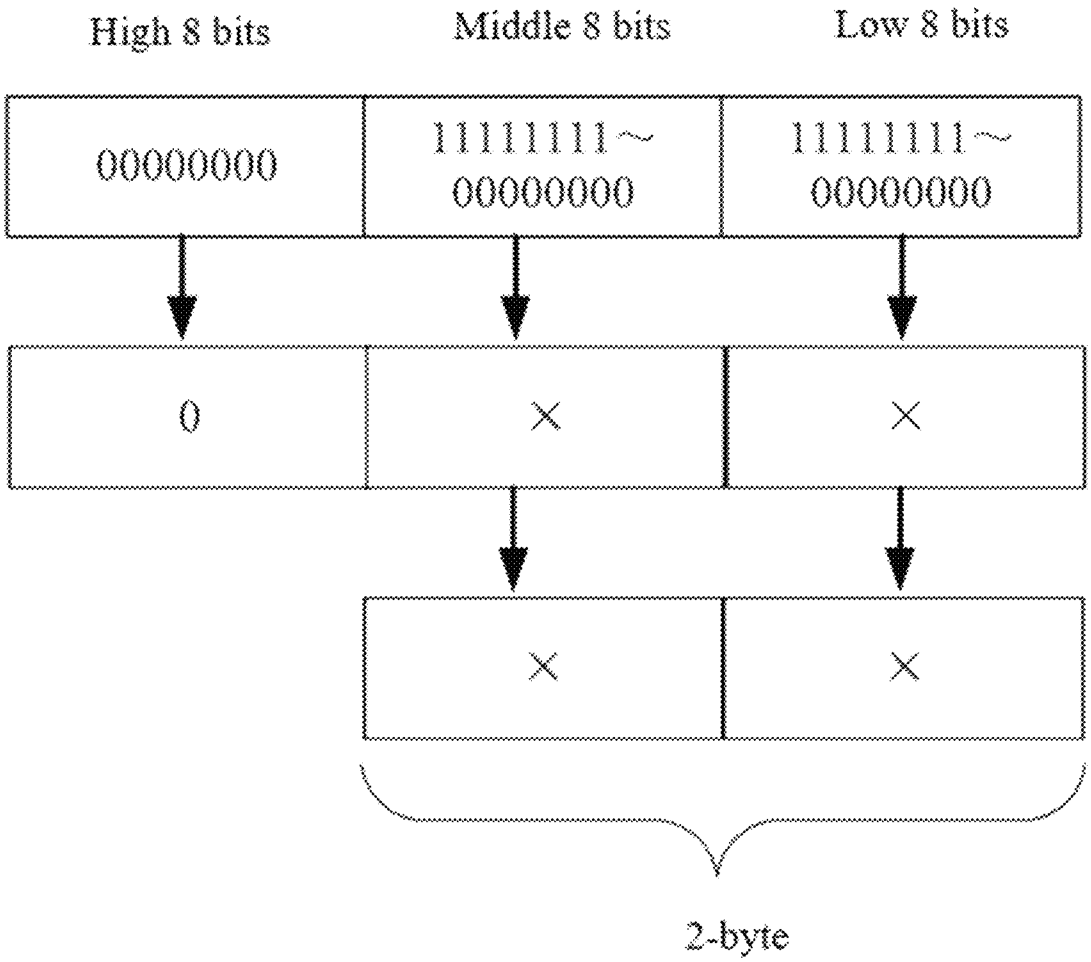
FIG. 14 schematically shows a third compression rule of the three-segment data processing approach according to an embodiment of the present invention.

FIGS. 12, 13 and 14 schematically show the first, second and third compression rules of the three-segment data processing approach according to an embodiment of the present invention.

In the three-segment data compression approach, the entire logging curve is divided into a first segment, a middle segment and a last segment. For the first segment and the middle segment, the useful signal is strong while the interference signal, such as noise, is weak. The useful signal is a main part of the signal. Therefore, the signal in the first segment and the middle segment plays a major role in ensuring the precision of data extraction and analysis.

The signal in the first segment is the strongest. A 24-bit voltage amplitude digital signal is collected for each time channel, wherein each bit in the high 8 bits is "1". That is, the high 8 bits are 11111111. The middle 8 bits and the low 8 bits both range from 11111111~00000000.

In this case, the high 8 bits are determined to be in the "1" format, and the middle 8 bits and the low 8 bits are determined to be in the "x" format. Based on the first compression rule of the three-segment data processing approach, the time spectrum data of this time channel is stored in the specified buffer area in the "1xx" 2-byte format after the high 8 bits are removed, as shown in FIG. 12.

The signal in the middle segment is strong. A 24-bit voltage amplitude digital signal is collected for each time channel, wherein the high 8 bits thereof range from 11111110~00000001, and the middle 8 bits and the low 8 bits still both range from 11111111~00000000.

In this case, the high 8 bits, the middle 8 bits and the low 8 bits are all determined to be in the "x" format. Based on the second compression rule of the three-segment data processing approach, the time spectrum data of this time channel is stored in the specified buffer area in the "xxx" 3-byte format, as shown in FIG. 13.

The signal in the last segment is weak. The high 8 bits in the time spectrum data collected for each time channel are 00000000.

In this case, the high 8 bits are determined to be in the "0" format, and the middle 8 bits and the low 8 bits are still determined to be in the "x" format. Based on the third compression rule of the three-segment data processing approach, the time spectrum data of this time channel is stored in the specified buffer area in the "0xx" 2-byte format after the high 8 bits are removed, as shown in FIG. 14.

In the last segment, the useful signal gradually weakens, and the interference signal, such as noise, becomes the main signal. Therefore, the removal of meaningless "0" byte in the present invention has no impact on the measurement precision of the transient electromagnetic resistivity logging device.

Figure 15:
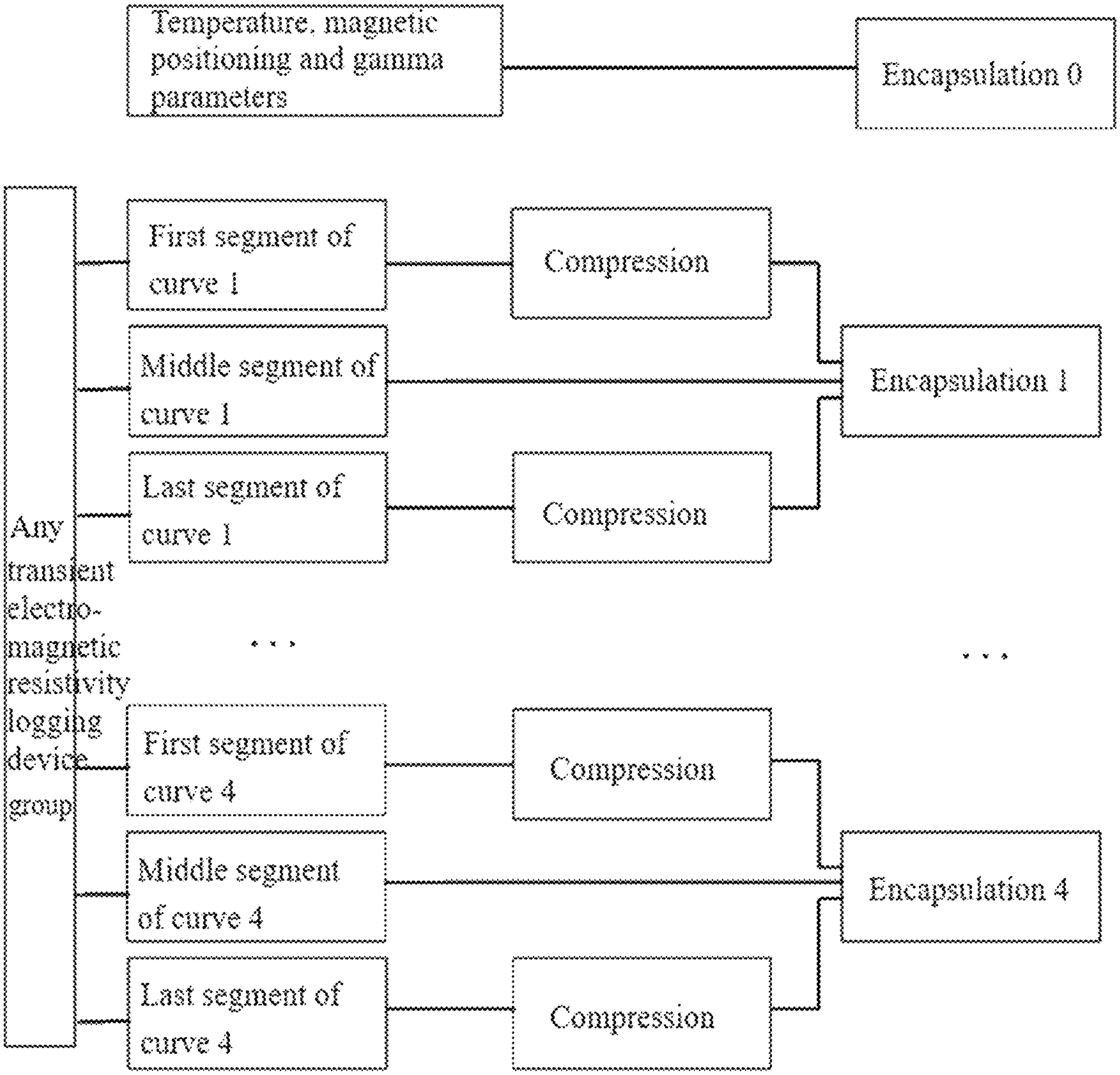
FIG. 15 schematically shows a three-segment data encapsulation approach according to an embodiment of the present invention.

FIG. 15 schematically shows a three-segment data encapsulation approach according to an embodiment of the present invention.

The present invention proposes a data encapsulation approach for a transient electromagnetic resistivity logging curve, which is used in cooperation with the three-segment data compression and storage approach. Specifically, the data in the first, second and third buffer areas in the three-segment data processing approach are integrally encapsulated to obtain encapsulated data corresponding to the downhole data to be processed. In addition, the collected downhole temperature, magnetic positioning and gamma data are processed and compiled to form standardized data, and then encapsulated to obtain downhole-environment encapsulated data. The encapsulated data and the downhole-environment encapsulated data are combined together to form a data stream, which is transmitted to the ground through the preset bus.

In one embodiment, before the logging operation, it is necessary to determine the number of downhole devices and the logging curve measurement tasks according to the logging requirements. In one embodiment, when it is necessary to provide transient electromagnetic resistivity logging data at different detection depths simultaneously, at least two transient electromagnetic resistivity logging devices for shallow detection and deep detection respectively need to be lowered simultaneously as the downhole resistivity logging devices. Specifically, when it is necessary to perform casing defect detection and through-casing measurement, one transient electromagnetic resistivity logging device needs to perform the measurement of at least four logging curves, i.e., provide four logging curves, including casing defect detection curve $\varepsilon_s$ and through-casing measurement curve $\zeta_s$ received when the transmitting coil transmits forward, and casing defect detection curve $\varepsilon_s'$ and through-casing measurement curve $\zeta_s'$ received when the transmitting coil transmits backward. Further, a suitable collection period for a logging depth measurement point is determined, in which each transient electromagnetic resistivity logging device completes four transient electromagnetic resistivity measurement curves for all time channels.

In one embodiment, for the shallow detection transient electromagnetic resistivity logging device, four transient electromagnetic resistivity logging curves at shallow detection depth are formed, i.e., $\varepsilon_s$ and $\varepsilon_s'$, $\zeta_s$ and $\zeta_s'$, wherein $\varepsilon_s$ and $\zeta_s$ are casing defect detection curve and through-casing measurement curve received when the transmitting coil transmits forward, respectively, and $\varepsilon_s'$ and $\zeta_s'$ are casing defect detection curve and through-casing measurement curve received when the transmitting coil transmits backward, respectively.

In one embodiment, for the deep detection transient electromagnetic resistivity logging device, four transient electromagnetic resistivity logging curves at deep detection depth are also formed, i.e., $\varepsilon_d$ and $\varepsilon_d'$, $\zeta_d$ and $\zeta_d'$.

Generally speaking, when it is necessary to provide transient electromagnetic resistivity logging data at different detection depths and perform both of casing defect detection and through-casing measurement, the data of eight curves are required in total, including time spectrum curve $\varepsilon_s$ characterized by formation resistivity signal and time spectrum curve $\zeta_s$ characterized by casing signal both under co-direction excitation of shallow detection, time spectrum curve $\varepsilon_s'$ characterized by formation resistivity signal and time spectrum curve $\zeta_s'$ characterized by casing signal both under reverse excitation of shallow detection, time spectrum curve $\varepsilon_d$ characterized by formation resistivity signal and time spectrum curve $\zeta_d$ characterized by casing signal both under co-direction excitation of deep detection, and time spectrum curve $\varepsilon_d'$ characterized by formation resistivity signal and time spectrum curve $\zeta_d'$ characterized by casing signal both under reverse excitation of deep detection.

In the present invention, the data streams from two transient electromagnetic resistivity logging device groups are integrated into one data stream for transmission to the ground, in order to save more time. Therefore, when it is necessary to transmit or store the information at one downhole depth measurement point, at least the data of eight time spectrum curves of two transient electromagnetic resistivity logging device groups need to be transmitted or stored.

As shown in FIG. 15, according to the first compression rule of the three-segment data processing approach, the downhole data to be processed generated by any one of transient electromagnetic resistivity logging devices, which belongs to the first segment of the curve $\zeta_s$, is compressed after the "1" in the high 8 bits are removed, and sent to the first buffer area of the three-segment data processing approach for data encapsulation. According to the second compression rule of the three-segment data processing approach, the downhole data which belongs to the middle section of the curve $\zeta_s$ needs no compression and directly sent to the second buffer area of the three-segment data processing approach for data encapsulation. According to the third compression rule of the three-segment data processing approach, the downhole data which belongs to the last section of the curve $\zeta_s$ is compressed after the "0" in the high 8 bits are removed, and sent to the third buffer area of the three-segment data processing approach for data encapsulation. Then, all the data of the curve $\zeta_s$ is integrally encapsulated to form encapsulation data 1.

As shown in FIG. 15, according to the first compression rule of the three-segment data processing approach, the downhole data to be processed generated by any one of transient electromagnetic resistivity logging devices, which belongs to the first segment of the curve $\varepsilon_s$, is compressed after the "1" in the high 8 bits are removed, and sent for data encapsulation. According to the second compression rule of the three-segment data processing approach, the downhole data which belongs to the middle section of the curve $\varepsilon_s$ needs no compression and directly sent for data encapsulation. According to the third compression rule of the three-segment data processing approach, the downhole data which belongs to the last section of the curve $\zeta_s$ is compressed after the "0" in the high 8 bits are removed, and sent for data encapsulation. Then, all the data of the curve $\varepsilon_s$ is integrally encapsulated to form encapsulation data 2.

As shown in FIG. 15, similarly, the downhole data to be processed generated by any one of transient electromagnetic resistivity logging devices which belongs to the curve $\zeta_s'$ and the curve $\varepsilon_s'$ is also compressed and encapsulated integrally to form encapsulation data 3 and encapsulation data 4 respectively, according to the three-segment data processing approach.

As shown in FIG. 15, the temperature, magnetic positioning and gamma parameters collected are processed and compiled to form standardized data, which is not compressed and directly encapsulated to form encapsulation data 0.

Meanwhile, the four logging data curves collected at one depth measurement point of another transient electromagnetic resistivity logging device are encapsulated, forming encapsulation data 5~8.

The four shallow detection transient electromagnetic resistivity logging curves and the four deep detection transient electromagnetic resistivity logging curves are encapsulated, forming encapsulation data 1~8, which are further encapsulated to form one data stream. The data stream is sent to the transmission module through a CAN bus. The CAN bus divides the measurement data of one data stream into 450~600 standard frames according to a CAN-bus format. Meanwhile, the temperature, magnetic positioning, and gamma parameters collected are processed and compiled to form standardized data, which is then encapsulated to form encapsulation data 0 and compiled in the CAN data stream.

The temperature, magnetic positioning and gamma parameters collected provide a correspondence relationship between the logging depth and the logging data of the transient electromagnetic resistivity downhole device, indicate the position of the casing collar in the casing well, and provide the gamma measurement data in the casing. Since the gamma curves measured before and after the wellbore is provided with the casing are not affected by the casing, the correspondence relationship between the logging depth and the logging data can be further established, and at the same time, a one-to-one correspondence between the casing and the formation outside the casing can be established by measuring the gamma curve in the casing and comparing it with the gamma curve before the casing is arranged.

Through the transmission module, the CAN data stream forms an AMI data stream in an AMI mode through an AMI bus, which is sent to the ground and received by a decompression unit on the ground. The AMI data stream is decompressed in the decompression unit according to compression algorithm and restored to lossless data in the standard format for interpretation and display, in order to form formation, wellbore or casing information legible and readily identifiable by drilling or logging engineers. It has been proved in practice that through the three-segment compression algorithm, a total transmission time of the CAN data stream formed is reduced from 120 ms before compression to no more than 90 ms, and a total transmission time of the AMI data stream formed is reduced from 400 ms before compression to no more than 300 ms.

Due to the data compression, the transmission time of AMI data stream is significantly reduced. When the three-segment data compression approach is adopted, the time for the AMI data stream to transmit the data of one depth measurement point is no more than 300 ms, with a data compression rate reaching 25-30% and a data lossless rate of 100%.

The uncompressed standard logging curve as shown in FIG. 2 includes at least 200 time channels, each of which has a 24-bit voltage amplitude digital signal. If each 24-bit voltage amplitude digital signal is allocated a 3-byte storage unit, the storage capacity of one logging curve is at least 600 bytes. Correspondingly, the storage capacity of eight time spectrum curves is at least 4800 bytes. If the three-segment compression approach is adopted, the total storage capacity is no more than 3600 bytes.

The three-segment data processing approach according to the present invention performs data compression on eight logging curves of the downhole near-detection and far-detection transient electromagnetic resistivity logging devices, which reduces the upload amount of the downhole logging data and improves the transmission capacity of the transmission channel, while ensuring the measurement precision of the downhole logging device. Through lossless data compression, the three-segment data processing approach implemented in production wells is able to increase the upload speed of downhole data and reduce the pressure of the communication channel, thus improving the logging timeliness and providing technical support for interpretation and result mapping of the logging data.

According to the present invention, a computer-readable storage medium is also provided corresponding to the data-compression determining and processing method for resistivity logging, and a system adopting the same. A computer program is stored on the storage medium for performing the data-compression determining and processing method for resistivity logging. The computer program can run computer instructions including computer program codes. The computer program codes may be in source code, object code, executable files, or certain intermediate forms, etc.

The computer-readable storage medium may include any entity or device capable of carrying computer program code, such as recording medium, USB flash drive, mobile hard disk, magnetic disk, optical disc, computer memory, Read-Only Memory (ROM), Random Access Memory (RAM), electrical carrier signals, telecommunication signals, and software distribution media, etc.

It should be noted that the content in the computer-readable storage medium can be appropriately increased or decreased according to the requirements of legislation and patent practice in the jurisdiction. According to legislation and patent practice in certain jurisdictions, for example, the computer-readable storage medium does not include electrical carrier signals and telecommunication signals.

In the above embodiments of the present invention, the method is described in detail. The method according to the present invention can be implemented by various forms of devices or systems. Therefore, according to other aspects of the method described in any one or more of the above embodiments, the present invention further proposes a data-compression determining and processing system for resistivity logging device, which is configured to perform the data-compression determining and processing method for resistivity logging device described in any one or more of the above embodiments. The particular embodiments are provided below for detailed description.

Figure 16:
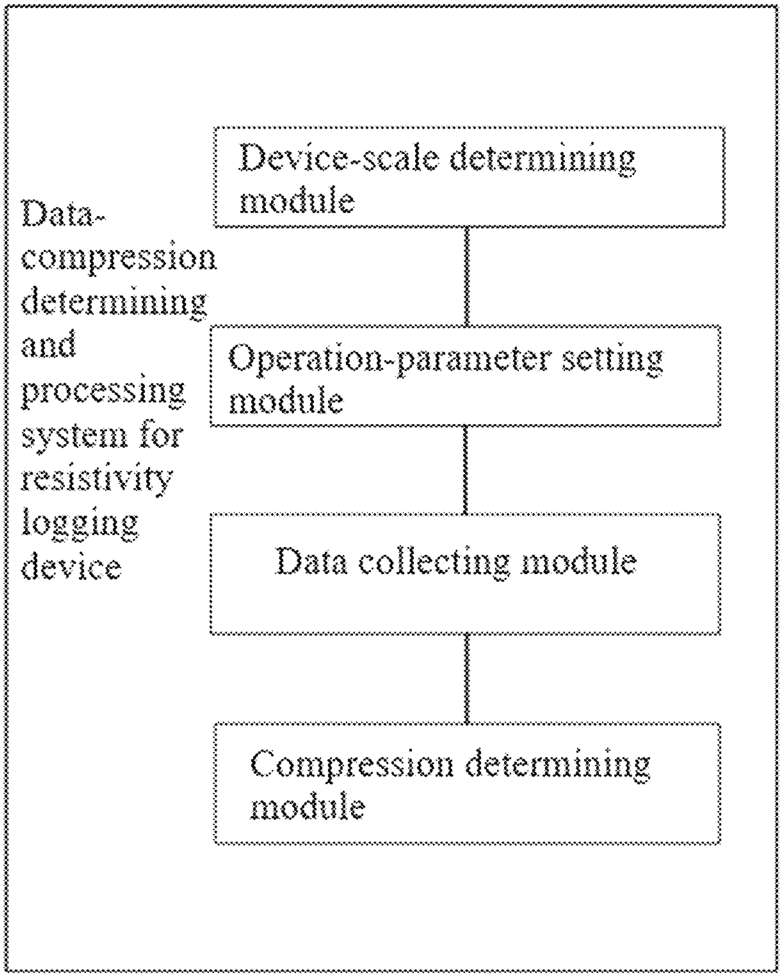
FIG. 16 schematically shows a structure of a data-compression determining and processing system for resistivity logging device according to an embodiment of the present invention.

FIG. 16 schematically shows a structure of a data-compression determining and processing system for resistivity logging device according to one embodiment of the present invention. As shown in FIG. 16, the system comprises:

a device-scale determining module, wherein the distribution of data that needs to be obtained simultaneously is analyzed, thus determining a scale configuration of the downhole resistivity logging device required at a same depth;

an operation-parameter setting module, wherein the measurement requirements of each downhole resistivity logging device group are determined, based on which a number of logging curves, a number of time channels in a logging cycle and the logging cycle of each downhole resistivity logging device are determined;

a data collecting module, wherein the resistivity logging curve is collected based on the configured downhole resistivity logging device, while specific downhole state data is collected by an associated data collection device; and a compression determining module, wherein whether the current collected data needs compression or not is determined according to a type thereof, and the compression requirements are analyzed for the data that needs compression, based on which a matching compression approach is selected.

Further, in one embodiment, the device-scale determining module is configured to determine the configuration of the downhole resistivity logging device at a same depth according to the following logics.

When an area where the data to be collected simultaneously is distributed only covers a near field area, at least one shallow detection resistivity logging device is adopted for detection at the same depth, as a downhole resistivity logging device group.

When the area where the data to be collected simultaneously is distributed only covers a far field area, at least one deep detection resistivity logging device is adopted for detection at the same depth, as a downhole resistivity logging device group.

When the area where the data to be collected simultaneously is distributed covers both the near field area and the far field area, at least one shallow detection resistivity logging device and at least one deep detection resistivity logging device are adopted for detection at the same depth, as a downhole resistivity logging device group, wherein the near field area and the far field area are divided according to a preset distribution distance threshold.

Further, in one embodiment, the operation-parameter setting module is configured to set the number of the logging curves of the downhole resistivity logging devices according to the following steps.

Data collection requirements are analyzed for each device in each downhole resistivity logging device group, based on which logging curves of a corresponding downhole resistivity logging device are generated, a total number of logging curves corresponding to all requirements indicating a total number of logging curves to be collected by the current logging device.

Specifically, in an optional embodiment, the operation-parameter setting module is configured to set the number of the logging curves of the downhole resistivity logging devices according to the following steps.

If casing defect detection function and through-casing measurement function need to be completed simultaneously, each resistivity logging device needs to provide four transient electromagnetic resistivity curves, including a casing defect detection curve and a through-casing measurement curve received when transmitting coil transmits forward and backward respectively.

Additionally, in one embodiment, setting the number of time channels and the logging cycle of the downhole resistivity logging device includes: obtaining the storage capacity of the downhole device, setting the number of data collection channels in a single cycle in combination with a precision target in the measurement requirements, and further determining a total time required for all time channels as the logging cycle based on a preset single-channel collection time.

In a preferred embodiment, the compression determining module determines whether the current data needs compression or not according to the following steps.

The type of the current data is identified. If the current data is one of the downhole state data, it is determined that the current data does not need compression, and thus can be directly processed and encapsulated by a standard downhole data processing structure. The downhole state data includes temperature, magnetic positioning and gamma parameters.

Moreover, if the current data is time spectrum data measured by the downhole resistivity logging device, it is determined that the current data needs to be compressed before encapsulation.

Further, in one embodiment, the compression determining module determines the compression approach for the current data according to the following logics.

When it is determined that the current data is the time spectrum data measured by the downhole resistivity logging device, the compression requirements on the current data is analyzed according to the number of logging curves, the number of data collection channels in a single cycle and the data timeliness requirement associated with the corresponding downhole resistivity logging device. Different compression approaches corresponding to different compression analysis rules are selected based on the compression requirements. The compression approaches include type I compression approach and type II deep compression approach.

In the data-compression determining system for resistivity logging device according to the embodiments of the present invention, each module or unit may operate independent from or in cooperation with each other according to actual needs of data collection and determination, in order to produce the corresponding technical effect.

The present invention further proposes a resistivity logging system, which comprises a resistivity logging device configured to perform the data-compression determining and processing method for resistivity logging, and a ground reception device configured to receive data transmitted by the resistivity logging device. In one embodiment, the resistivity logging device is a transient electromagnetic resistivity logging device.

To sum up, the present invention proposes a data-compression determining and processing method for resistivity logging, and a system adopting the same, which have the following advantages compared with the prior arts.

(a) By analyzing the distribution of data that needs to be obtained simultaneously, the present invention determines the scale configuration of the downhole resistivity logging devices for logging at a same depth, so that it is able to control the number of downhole logging devices flexibly and ensure that the logging requirements can be met without generating redundant logging data, serving as a reliable basis for subsequent determination of compression approaches.

(b) The number of logging curves, the number of time channels in a cycle, and the logging cycle of each downhole resistivity logging device are determined based on the measurement requirements thereof, so that the number of logging curves and the number of time channels can match the logging requirements, thus avoiding the one-size-fits-all configuration of logging devices for various logging operations. In this manner, the problems including insufficient logging data or the amount of logging data exceeding the storage space of the device can be eradicated from the source, while the determination of compression approaches can be also supported.

(c) The configured downhole resistivity logging devices are lowered into the well to collect resistivity logging curves. Meanwhile, the downhole state data is collected by the data collection device. The data that needs compression is selected according to the type thereof, for which the compression requirements are analyzed correspondingly, in order to select a matching compression approach. In this method, not all logging data is compressed. Instead, the data type and the logging requirements are both taken into consideration. The compressible data bytes that need compression are selected to realize precise and efficient compression. In practice, users can flexibly select data according to needs, in order to improve the upload speed of downhole data and reduce the pressure on the communication channel. In the meantime, the method and system according to the present application can also improve logging timeliness, providing a reliable technical support for the interpretation of logging data and the mapping of results.

(d) In terms of design concepts, the two-segment and three-segment data processing approaches according to the present invention do not adopt statistical-based and dictionary-based compressions commonly seen in the prior arts. Instead, a new two-segment and three-segment data compression and encapsulation method is customized according to the actual measurement curves of downhole logging devices. Compared with common compression algorithms in the prior arts, the method according to the present application can better adapt to downhole logging devices without complex algorithm, and thus is simpler and more convenient to perform. In terms of effect, the present invention can achieve lossless compression, wherein the downhole measurement data can be precisely restored after being decoded on the ground.

It should be understood that the embodiments of the present invention are not limited to the specific structures, processing steps or materials disclosed herein, but should extend to equivalent substitutions of these features understood by one ordinarily skilled in the art. It should also be understood that the terminology used herein is for the purpose of describing a particular embodiment only, rather than being construed as restriction.

In the description of the present invention, "a plurality of" means two or more, unless otherwise specified. It is to be noted that the directions or positions indicated by the terms "upper", "lower", "left", "right", "inner", "outer", "front end", "rear end", "head", "tail", etc. in the present application are all directed to the corresponding drawings, and are used for illustrative purposes of the present invention and simplified illustration only, which are not intended to indicate or imply a particular orientation, or the configuration and operation of a device or element in a particular orientation. Therefore, the above terms are not intended to restrict the present invention. It should also be understood that in the present invention, the terms "first", "second" and "third" are used for illustrative purposes only, and are not intended to indicate or imply relative importance.

In the present invention, unless otherwise specified or defined, the phrases "connect", "attach", and the like, should be understood in a broad sense, and may be understood as, for example, fixed connections, detachable connections, or integral connections; mechanical or electrical connections; or direct connections or indirect connections via intermediate structure. The specific meanings of the above phrases in the present invention can be understood by one skilled in the art in accordance with specific conditions.

Certain terms are used consistently throughout the present application for indicating specific system components. As those skilled in the art will recognize, the same component can generally be denoted by different names. Therefore, the present application does not intend to distinguish components that differ only in name rather than in function. In the present application, the terms "comprise", "include" and "have" are used in an open-ended manner, and thus should be understood as "including but not limited to . . . ". Additionally, the terms such as "substantially", "essentially" or "approximately" as may be used herein refer to tolerances acceptable in the field for corresponding terms. For instance, the term "coupling" as may be used herein includes direct coupling and indirect coupling via additional components, elements, circuits, or modules. For indirect coupling, the intervening components, elements, circuits, or modules do not alter signal information, but can adjust current, voltage and/or power levels thereof. Inferred coupling (for example, one element is coupled to another element via inference) includes direct and indirect coupling between two elements in a same manner as "coupling".

The phrase "an embodiment" or "embodiments" as mentioned in the description means that the particular features, structures or characteristics described in conjunction with the embodiment or embodiments are included in at least one embodiment of the present invention. Thus, the phrase "an embodiment" or "embodiments" used throughout the description does not necessarily refer to the same embodiment.

The embodiments of the present invention are provided for purposes of illustration and description, but are not intended to be exhaustive, or to limit the present invention as disclosed herein. Many modifications and variations will be obvious to those skilled in the art. The embodiments are selected and described to better illustrate the principles and practical applications of the present invention, so that those skilled in the art can understand the present invention and thus design various embodiments with various modifications suitable for specific purposes.

Although the embodiments of the present invention are described hereinabove, the disclosure is provided for facilitating to understand the implementing mode of the present invention, but rather restricting the present invention. Without departing from the spirit and scope of the present disclosure, one skilled in the art can make various modifications and improvements in forms and details of the implementing mode. The scope of protection of the present invention shall be determined by the appending claims.

The invention claimed is:

1. A data-compression determining and processing method for resistivity logging, comprising steps of:

determining logging requirements, and collecting downhole data to be processed by a resistivity logging device; and selecting a compression processing approach based on compression requirements, so as to compress the downhole data to be processed, wherein a two-segment data processing approach is selected when a required compression ratio is less than a preset compression ratio, and a three-segment data processing approach is selected when the required compression ratio is larger than or equal to the preset compression ratio.

2. The data-compression determining and processing method according to claim 1, characterized in that the two-segment data processing approach comprises steps of:

processing, based on a sequence of time channels of the downhole data to be processed, time spectrum data corresponding to each time channel according to a first compression rule; and processing, when the first compression rule is not applicable to the time spectrum data corresponding to a certain time channel, the time spectrum data corresponding to each of the time channels starting from current time channel according to a second compression rule.

3. The data-compression determining and processing method according to claim 2, characterized in that the method further comprises steps of:

determining, when any bit within a specific bit range of the current time spectrum data is not a first preset value and thus the first compression rule is applicable, the current time spectrum data as incompressible data according to the first compression rule, and directly storing the current time spectrum data in a first buffer area; and determining, when each bit within the specific bit range of the current time spectrum data is the first preset value and thus the first compression rule is not applicable, the current time spectrum data as compressible data according to the second compression rule, and storing, after removing the data within the specific bit range of the current time spectrum data, remaining data in a second buffer area.

4. The data-compression determining and processing method according to claim 2, characterized in that the time spectrum data is a 24-bit voltage amplitude digital signal, and the method further comprises steps of:

determining, when any bit in high 8 bits of the current time spectrum data is not "0" and thus the first compression rule is applicable, the current time spectrum data as incompressible data according to the first compression rule, and directly storing the current time spectrum data in the first buffer area in a 3-byte format; and determining, when each bit in the high 8 bits of the current time spectrum data is "0" and thus the first compression rule is not applicable, the current time spectrum data as compressible data according to the second compression rule, and storing, after removing "0" in the high 8 bits of the current time spectrum data, remaining data in the second buffer area in a 2-byte format.

5. The data-compression determining and processing method according to claim 1, characterized in that the three-segment data processing approach comprises steps of:

processing, based on a sequence of time channels of the downhole data to be processed, time spectrum data corresponding to each time channel according to a third compression rule;

processing, when a fourth compression rule is applicable to the time spectrum data corresponding to a certain time channel, the time spectrum data corresponding to each of the time channels starting from current time channel according to the fourth compression rule; and processing, when a fifth compression rule is applicable to the time spectrum data corresponding to a certain time channel, the time spectrum data corresponding to each of the time channels starting from current time channel according to the fifth compression rule.

6. The data-compression determining and processing method according to claim 5, characterized in that the method comprises steps of:

determining, when each bit within a specific bit range of the current time spectrum data is a second preset value and thus the third compression rule is applicable, the current time spectrum data as compressible data according to the third compression rule, and storing, after removing the data in the specific bit range of the current time spectrum data, remaining data in a third buffer area;

determining, when the specific bit range of the current time spectrum data includes both the second preset value and a third preset value and thus the fourth compression rule is applicable, the current time spectrum data as incompressible data according to the fourth compression rule, and directly storing the current time spectrum data in a fourth buffer area; and determining, when each bit within the specific bit range of the current time spectrum data is a third preset value and thus the fifth compression rule is applicable, the current time spectrum data as compressible data according to the fifth compression rule, and storing, after removing the data in the specific bit range of the current time spectrum data, remaining data in a fifth buffer area.

7. The data-compression determining and processing method according to claim 5, characterized in that the time spectrum data is a 24-bit voltage amplitude digital signal, and the method further comprises steps of:

determining, when each bit within high 8 bits of the current time spectrum data is "1" and thus the third compression rule is applicable, the current time spectrum data as compressible data according to the third compression rule, and storing, after removing "1" in the high 8 bits of the current time spectrum data, remaining data in the third buffer area in a 2-byte format;

determining, when the high 8 bits of the current time spectrum data include both "1" and "0" and thus the fourth compression rule is applicable, the current time spectrum data as incompressible data according to the fourth compression rule, and directly storing the current time spectrum data in the fourth buffer area in a 3-byte format; and determining, when each bit within the high 8 bits of the current time spectrum data is "0" and thus the fifth compression rule is applicable, the current time spectrum data as compressible data according to the fifth compression rule, and storing, after removing "0" in the high 8 bits of the current time spectrum data, remaining data is stored in the fifth buffer area in the 2-byte format.

8. The data-compression determining and processing method according to claim 1, characterized in that the logging requirements include detection area requirements, wherein:

when only a near field area needs to be detected, at least one shallow detection resistivity logging device is adopted at a same depth;

when only a far field area needs to be detected, at least one deep detection resistivity logging device is adopted at a same depth; and when both the near field area and the far field area need to be detected, at least one shallow detection resistivity logging device and at least one deep detection resistivity logging device are adopted at a same depth, wherein the near field area and the far field area are divided according to a preset distance threshold.

9. The data-compression determining and processing method according to claim 1, characterized in that the logging requirements include measurement requirements, wherein:

when casing defect detection function and through-casing measurement function need to be completed simultaneously, each resistivity logging device is configured to complete four transient electromagnetic resistivity logging curves, which include a casing defect detection curve and a through-casing measurement curve received when a transmitting coil of each resistivity logging device transmits forward, and a casing defect detection curve and a through-casing measurement curve received when the transmitting coil of each resistivity logging device transmits backward.

10. The data-compression determining and processing method according to claim 9, characterized in that the logging requirements include operation parameter requirements, wherein:

a storage capacity of the resistivity logging device is obtained, and a number of data collection channels in a single cycle is determined in combination with a precision target in the measurement requirements, based on which a total time required for all time channels is determined as a logging cycle in combination with a preset single-channel collection time.

11. The data-compression determining and processing method according to claim 1, characterized in that the downhole data to be processed refers to voltage amplitude digital signals output by a reception coil of the resistivity logging device when the resistivity logging device completes measurement of one logging curve within one collection period at a certain downhole depth measurement point, wherein one collection period is evenly divided into multiple time channels, and the time spectrum data refers to the voltage amplitude digital signal output by the reception coil at a certain moment within each time channel.

12. The data-compression determining and processing method according to claim 1, characterized in that the method further comprises steps of:

processing and compiling collected downhole temperature, magnetic positioning and gamma data to form standardized data, which is encapsulated to obtain downhole-environment encapsulated data, wherein the downhole temperature, magnetic positioning and gamma data correspond to a logging depth of the downhole data to be processed, indicating a position of a casing collar in a casing well and providing gamma measurement data in the casing; and encapsulating the compressed downhole data to be processed, which is combined with the downhole-environment encapsulated data to form a data stream, wherein the data stream is transmitted to the ground through a preset bus.

13. A storage medium, which comprises a series of instructions for performing the steps of the method according to claim 1.

14. A resistivity logging system, comprising:

a resistivity logging device configured to perform the method according to claim 1; and a ground reception device configured to receive data transmitted by the resistivity logging device.

15. The resistivity logging system according to claim 14, characterized in that the resistivity logging device is a transient electromagnetic resistivity logging device.

* * * * *